(12) United States Patent
Nakase

(10) Patent No.: US 6,753,697 B2
(45) Date of Patent: Jun. 22, 2004

(54) SEMICONDUCTOR DEVICE CAPABLE OF MAINTAINING OUTPUT SIGNAL EVEN IF INTERNAL POWER SUPPLY POTENTIAL IS TURNED OFF

(75) Inventor: Yasunobu Nakase, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/234,241

(22) Filed: Sep. 5, 2002

(65) Prior Publication Data

US 2003/0146776 A1 Aug. 7, 2003

(30) Foreign Application Priority Data

Feb. 1, 2002 (JP) .................................... 2002-025911

(51) Int. Cl.[7] .......................................... H03K 19/175
(52) U.S. Cl. ............................ 326/68; 326/62; 326/81; 326/83; 326/56; 327/333
(58) Field of Search .............................. 326/56–58, 62, 326/63, 68, 80, 81, 83, 113, 30; 327/51–57, 108, 112, 333

(56) References Cited

U.S. PATENT DOCUMENTS

| 4,980,583 | A | | 12/1990 | Dietz | |
|---|---|---|---|---|---|
| 5,627,487 | A | * | 5/1997 | Keeth | 327/112 |
| 6,107,830 | A | * | 8/2000 | Okumura | 326/58 |
| 6,501,306 | B1 | * | 12/2002 | Kim et al. | 327/112 |

FOREIGN PATENT DOCUMENTS

JP        7-106946      4/1995

* cited by examiner

Primary Examiner—Vibol Tan
(74) Attorney, Agent, or Firm—McDermott, Will & Emery

(57) ABSTRACT

Even if a power supply potential VDD of a core section is set in an off state, a latch of a level conversion circuit holds a value corresponding to an output. It is, therefore, possible for a semiconductor device to hold an output state of an output node. Thereafter, an enable signal is deactivated, whereby the output node can be set in a high impedance state and a bus or the like can be released to the other device.

16 Claims, 15 Drawing Sheets

US 6,753,697 B2

SEMICONDUCTOR DEVICE CAPABLE OF MAINTAINING OUTPUT SIGNAL EVEN IF INTERNAL POWER SUPPLY POTENTIAL IS TURNED OFF

BACKGROUND OF THE INVENTION

1. Field of the Invention

The present invention relates to a semiconductor device which employs two or more power supply potentials, and more specifically to a semiconductor device which includes a level shift circuit transmitting a signal from a lower voltage power supply circuit to a high voltage power supply circuit.

2. Description of the Background Art

Recently, with the development of a microscopic processing technique for semiconductors, the number of transistors which can be integrated on one chip has surprisingly increased. At the same time, the restriction of voltage which can be applied to a transistor has become stricter. Further, it is inevitable to decrease a power supply potential so as to suppress the increase of consumption power following the increase of the number of transistors to be integrated. At present, in case of a MOS transistor which is used most widely, as a minimum processing dimension decreases to 0.25 μm, to 0.18 μm and to 0.15 μm, a power supply potential decreases to 2.5 V, to 1.8 V and to 1.5V, respectively. The power supply potentials is used in the core section of an integrated circuit and is, therefore, referred to as VDD.

Meanwhile, a power supply potential VDDH of an interface section which exchanges signals with other chips is set higher than that of the core section, irrespectively of the development of the processing technique. Normally, power supply potential VDDH is set at 3.3 V. A state-of-the-art transistor cannot be employed at a voltage of 3.3 V. Though the performance is considerably lower, a transistor is used at the interface section of which gate oxide film is intentionally made thicker than that of the transistor at the core section.

The reason of setting the power supply potential of the interface section high is as follows. Since all of semiconductor devices mounted on a printed wiring board are not manufactured by the state-of-the-art processing technique and many semiconductor devices still operate according to a conventional interface standard, the change of the interface standard brings about much confusion.

Furthermore, since the interface section is provided in proximity to an input/output pin, it is necessary to increase resistance against surge breakdown of the input/output pin caused by an electrostatic force. If the thickness of the gate oxide film of a transistor in the interface section is set large, the resistance of the semiconductor device advantageously increases.

As stated above, if two or more power supply potentials are employed, it is necessary to provide a level conversion circuit (level shift circuit) which shifts the amplitude of a signal potential among circuit blocks using the respective power supply potentials.

FIG. 20 is a circuit diagram for explaining level shift sections arranged in the connection section between two circuit blocks having different power supply potentials, respectively.

Referring to FIG. 20, a core section 502 is a circuit which receives power supply potential VDD as an operating power supply potential. Core section 502 includes a NAND circuit G50 which receives signals D0 and EN, an inverter 506 which receives and inverts the output of NAND circuit G50, an inverter 504 which receives and inverts signal EN, a NOR circuit G51 which receives the output of inverter 504 and signal D0, and an inverter 508 which receives and inverts the output of NOR circuit G51.

An interface section 503 is a circuit which receives power supply potential VDDH as an operating power supply potential. Interface section 503 includes level shift circuits 513 and 515, and a driving section 519 which drives an output node D3 in accordance with data held in level shift circuits 513 and 515.

Level shift circuit 513 includes a P-channel MOS transistor P50 which is connected between a node applied with power supply potential VDDH and a node D54 and which has a gate connected to a node D51, an N-channel MOS transistor N50 which is connected between node D54 and a ground node and which has a gate receiving the output of NAND circuit G50, a P-channel MOS transistor P51 which is connected between the node applied with power supply potential VDDH and node D51 and which has a gate connected to node D54, and an N-channel MOS transistor N51 which is connected between node D51 and the ground node and which has a gate receiving the output of inverter 506.

Level shift circuit 515 includes a P-channel MOS transistor P52 which is connected between a node applied with power supply potential VDDH and a node D55 and which has a gate connected to a node D52, an N-channel MOS transistor N52 which is connected between node D55 and the ground node and which has a gate receiving the output of NOR circuit G51, a P-channel MOS transistor P53 which is connected between the node applied with power supply potential VDDH and node D52 and which has a gate connected to node D55, and an N-channel MOS transistor N53 which is connected between node D52 and the ground node and which has a gate receiving the output of inverter 508.

Driving section 519 includes an inverter 520 which has an input connected to node D51, an inverter 522 which receives and inverts the output of inverter 520, and a P-channel MOS transistor PD1 which is connected between the node applied with power supply potential VDDH and output node D3 and which has a gate receiving the output of inverter 522.

Driving section 519 also includes an inverter 524 which has an input connected to node D52, an inverter 526 which receives and inverts the output of inverter 524, and an N-channel MOS transistor ND1 which is connected between output node D3 and the ground node and which has a gate receiving the output of inverter 526.

A level shift operation will be briefly described. Data is applied as signal D0 from an internal circuit, not shown, included in core section 502. If output enable signal EN is at H level, the data is outputted from output node D3 to the outside of the chip.

If output enable signal EN is at L level, both of output transistors PD1 and ND1 are turned off and output node D3 is set in a high impedance state.

A case where L level is outputted as the data from output node D3 will be considered. In this case, output enable signal EN is set at H level (VDD) and data signal D0 is set at L level (GND). Since the output of NAND circuit G50 is at H level (VDD) on an output transistor PD1 side, N-channel MOS transistor N50 is turned on and N-channel MOS transistor N51 is turned off. Accordingly, P-channel MOS transistor P50 is turned off and P-channel MOS transistor P51 is turned on. As a result, node D54 of level shift circuit 513 is set at L level (GND) and node D51 is set at H level (VDDH). Since the gate potential of output transistor PD1 is at H level (VDDH), output transistor PD1 is turned off.

On the other hand, since the output of NOR circuit G51 is at H level (VDD) on an output transistor ND1 side, N-channel MOS transistor N52 is turned on and N-channel MOS transistor N53 is turned off. Accordingly, P-channel MOS transistor P52 is turned off and P-channel MOS transistor P53 is turned on. As a result, node D55 of level shift circuit 515 is set at L level (GND) and node D52 thereof is set at H level (VDDH). The gate potential of output transistor ND1 is at H level (VDDH) and output node D3 is driven to L level (GND).

A case where H level is outputted as the data from output node D3 will next be considered. In this case, output enable signal EN is set at H level (VDD) and data signal D0 is also set at H level (VDD).

Since the output of NAND circuit G50 is at L level (GND) on the output transistor PD1 side, N-channel MOS transistor 50 is turned off and N-channel MOS transistor N51 is turned on. Accordingly, P-channel MOS transistor P50 is turned on and P-channel MOS transistor P51 is turned off. As a result, node D54 of level shift circuit 513 is set at H level (VDDH) and node D51 thereof is set at L level (GND). Since the gate potential of output transistor PD1 is at L level (GND), output node D3 is driven to H level (VDDH).

On the other hand, since the output of NOR circuit G51 is at L level (GND) on the output transistor ND1 side, N-channel MOS transistor N52 is turned off and N-channel MOS transistor N53 is turned on. Accordingly, P-channel MOS transistor P52 is turned on and P-channel MOS transistor P53 is turned off. As a result, node D55 of level shift circuit 515 is set at H level (VDDH) and node D52 thereof is set at L level (GND). The gate potential of output transistor ND1 is at L level (GND) and output transistor ND1 is turned off.

A case where no data is outputted from output node D3 will be considered. In this case, output enable signal EN is set at L level (GND).

Since the output of NAND circuit G50 is at H level (VDD) on the output transistor PD1 side, N-channel MOS transistor 50 is turned on and N-channel MOS transistor N51 is turned off. Accordingly, P-channel MOS transistor P50 is turned off and P-channel MOS transistor P51 is turned on. As a result, node D54 of level shift circuit 513 is set at L level (GND) and node D51 thereof is set at H level (VDDH). Since the gate potential of output transistor PD1 is at H level (VDDH), output transistor PD1 is turned off.

On the other hand, since the output of NOR circuit G51 is at L level (GND) on the output transistor ND1 side, N-channel MOS transistor N52 is turned off and N-channel MOS transistor N53 is turned on. Accordingly, P-channel MOS transistor P52 is turned on and P-channel MOS transistor P53 is turned off. As a result, node D55 of level shift circuit 515 is set at H level (VDDH) and node D52 thereof is set at L level (GND). The gate potential of output transistor ND1 is at L level (GND) and output transistor ND1 is turned off.

As can be seen, if both of two output transistors PD1 and ND1 are turned off, output node D3 turns into a high impedance state.

As stated above, VDD is supplied, as H level, to the input terminals of level shift circuits 513 and 515, i.e., to the gates of N-channel MOS transistors N50 to N53, respectively. Since power supply potential VDD is higher than the threshold voltage Vthn of each of these N-channel MOS transistors, the N-channel MOS transistors can be turned on.

The gate potential of the P-channel MOS transistor, among P-channel MOS transistors P50 to P53 of level shift circuits, which is connected to the drain of the N-channel MOS transistor which is turned on, is driven to GND. Due to this, the corresponding P-channel MOS transistor becomes conductive and the potential of output node D51 or D52 is raised to power supply potential VDDH. The logical amplitude of each of output nodes D51 and D52, therefore, ranges from GND to VDDH.

In the meantime, as portable terminals have recently spread, the reduction of consumption power becomes the most significant challenge. Various techniques have been proposed particularly for reducing consumption power in a standby state. They involve, for example, a technique for changing a substrate potential, setting the threshold voltage of a transistor high and thereby decreasing leak current, a technique for supplying power to the entire core circuit through a switching transistor having high threshold voltage, turning off the switching transistor in a standby state and thereby decreasing leak current, and the like.

The most efficient method is to turn off power itself. In this case, it is necessary to turn off only the power of the core section and to hold the power of the interface section as it is in the standby state for the following reasons.

First, since there are cases where a device which is set in a standby state supplies a control signal to the other device, it is undesirable that the control signal becomes unstable. Second, if the power of the interface section is turned off, the potentials of the gate and the source of output transistor PD1 become the ground potential (GND). In this state, if the potential of a bus connected to the output node becomes H level, current is carried from output node D3 to the node which receives power supply potential VDDH through output transistor PD1. If so, not only unnecessary current is carried to the node but also the operation of the device disadvantageously becomes slow.

In this case, however, according to the conventional technique shown in FIG. 20, the potential of output node D3 becomes unstable. Namely, if power supply potential VDD of the core section is turned off, both of the gate inputs become L level and both of N-channel MOS transistors N50 and N51 are, therefore, turned off. Since node D51 tends to be set at L level by the influence of leak current and noise, output transistor PD1 may possibly become conductive.

Further, the gate inputs of N-channel MOS transistors N52 and N53 are both at L level. Due to this, if node D52 is set at H level by the influence of leak current and noise, output transistor ND1 may possibly become conductive. If both of the transistors as the output drivers become conductive, penetrating current flows in large quantities. Moreover, the potential of output node D3 becomes unstable depending on the conductive degree of the both drivers. If this device, which is in a standby state, controls the other device, malfunction disadvantageously occurs.

To keep the outputs of the level shift circuits constant even after the power of the core section is shut down, a data latch function may be added.

FIG. 21 is a circuit diagram showing a conventional technique for providing a level shift circuit section with a latch function.

Referring to FIG. 21, a core section 502A receives power supply potential VDD as an operating power supply potential, and includes a NAND circuit G52 which receives signals D0 and EN, an inverter 556 which receives and inverts the output of NAND circuit G52, an inverter 554 which receives and inverts signal D0, a NAND circuit G53 which receives the output of inverter 554 and signal EN, and an inverter 558 which receives and inverts the output of NAND circuit G53.

An interface section 503A receives power supply potential VDDH as an operating power supply potential. Interface section 503A includes a level shift circuit 513A which holds predetermined data according to the output of NAND circuit G52 and that of inverter 556, a level shift circuit 515A which holds predetermined data according to the output of NAND circuit G53 and that of inverter 558, and driving section 519 which drives output node D3 according to the data held in level shift circuits 513A and 515A.

Since driving section 519 is equal in configuration to driving section 519 shown in FIG. 20, it will not be repeatedly described herein.

Level shift circuit 513A includes an N-channel MOS transistor N60 which is connected between a node D64 and a ground node and which has a gate receiving the output of NAND circuit G52, and an N-channel MOS transistor N61 which is connected between node D51 and the ground node and which has a gate receiving the output of inverter 556.

Level shift circuit 513A also includes an inverter 560 which has an input connected to node D64 and an output connected to node D51, and an inverter 562 which has an input connected to node D51 and an output connected to node D64.

Level shift circuit 515A includes an N-channel MOS transistor N63 which is connected between node D52 and the ground node and which has a gate receiving the output of NAND circuit G53, and an N-channel MOS transistor N62 is connected between a node D65 and the ground node and which has a gate receiving the output of inverter 558.

Level shift circuit 515A also includes an inverter 564 which has an input connected to node D65 and an output connected to node D52, and an inverter 566 which has an input connected to node D52 and an output connected to node D65.

The semiconductor device according to the conventional technique has a feature in that a latch having two cross-coupled inverters is provided in each of level shift circuits 513A and 515A which apply signals to output transistors PD1 and ND1, respectively. Data is written to the latches using N-channel MOS transistors N60 to N63.

Now, a case where L level is outputted as the data from output node D3 will be considered. In this case, output enable signal EN is set at H level (VDD) and signal D0 is set at L level. On an output transistor PD1 side, N-channel MOS transistor N60 is turned on and N-channel MOS transistor N61 is turned off. As a result, node D64 of level shift circuit 513A is set at L level (GND) and node D51 thereof is set at H level (VDDH). Since the gate potential of output transistor PD1 is at H level (VDDH), output transistor PD1 is turned off.

On the other hand, N-channel MOS transistor N62 is turned on and N-channel MOS transistor N63 is turned off on an output transistor ND1 side. As a result, node D65 of level shift circuit 515A is set at L level (GND) and node D52 thereof is set at H level (VDDH). Since the gate potential of output transistor ND1 is at H level (VDDH), output transistor ND1 becomes conductive to thereby drive output node D3 to L level (GND).

Next, a case where H level is outputted as the data from output node D3 will be considered. In this case, output enable signal EN is set at H level (VDD) and signal D0 is set at H level. On the output transistor PD1 side, N-channel MOS transistor N60 is turned off and N-channel MOS transistor N61 is turned on. As a result, node D64 of level shift circuit 513A is set at H level (VDDH) and node D51 thereof is set at L level (GND). Since the gate potential of output transistor PD1 is at L level (GND), output transistor PD1 becomes conductive to thereby drive output node D3 to H level (VDDH).

On the other hand, on the output transistor ND1 side, N-channel MOS transistor N62 is turned off and N-channel MOS transistor N63 is turned on. As a result, node D65 of level shift circuit 515A is set at H level (VDDH) and node D52 thereof is set at L level (GND). Since the gate potential of output transistor ND1 is at L level (GND), output transistor ND1 is turned off.

A case where no data is outputted from output node D3 will be considered. In this case, output enable signal EN is set at L level (GND). On the output transistor PD1 side, N-channel MOS transistor N60 is turned on and N-channel MOS transistor N61 is turned off. As a result, node D64 of level shift circuit 513A is set at L level (GND) and node D51 thereof is set at H level (VDDH). Since the gate potential of output transistor PD1 is at H level (VDDH), output transistor PD1 is turned off.

On the other hand, on the output transistor ND1 side, N-channel MOS transistor N62 is turned off and N-channel MOS transistor N63 is turned on. As a result, node D65 of level shift circuit 515A is set at H level (VDDH) and node D52 thereof is set at L level (GND).

The gate potential of output transistor ND1 is at L level (GND), and output transistor ND1 is turned off. Since both of output transistors PD1 and ND1 are turned off, output node D3 turns into a high impedance state.

If power supply potential VDD of the core section is shut down while H or L level or high impedance is outputted from output node D3, the inputs of level shift circuits 513A and 515A, i.e., the gate potentials of N-channel MOS transistors N60 to N63 all become L level (GND). However, since setting values for controlling output transistors PD1 and ND1 are held by the latches, respectively, the potentials of nodes D51 and D52 are both fixed to L level (GND) or H level (VDDH). Due to this, it is possible to prevent the disadvantage of the conventional technique shown in FIG. 20 that both of the transistors as the output drivers are turned on.

Nevertheless, there are cases where after a state in which H level or L level is supplied to the other device through a control signal line is continued for a constant period, the control signal line must be released to yet another device. In that case, the output node is normally set in a high impedance state. According to the conventional techniques described with reference to FIGS. 20 and 21, however, the interface section cannot recognize output enable signal EN after power supply potential VDD of the core section is shut down. Thus, a problem that the output node cannot be set in a high impedance state disadvantageously occurs.

The fall of the potentials of input signals to the level shift circuits when the power of the core section is shut down, is quite slow compared with the ordinary fall of a signal waveform. If a control signal is inputted to force the output node to be set in a high impedance state so as to solve the above-stated disadvantages, this control signal competes with the input signal in the interface section and penetrating current sometimes flows in the interface section. Further, after the power of the core section is shut down, input signals to the level shift circuits both turn into a high impedance state, so that erroneous data may possibly be set by the influence of noise and the like.

SUMMARY OF THE INVENTION

It is an object of the present invention to provide a semiconductor device capable of setting an output node in a high impedance state even if the power of a core section is turned off and capable of decreasing penetrating current when the output node is changed from an active state to a high impedance state.

It is another object of the present invention to provide a semiconductor device capable of preventing output malfunction caused by the influence of noise generated in an input signal to a level shift circuit if the power of a core section is shut down.

In short, this invention provides a semiconductor device which includes an internal circuit and an interface section.

The internal circuit receives a first power supply potential as an operating power supply potential, and outputs a first internal signal. The interface circuit receives, as an operating power supply potential, a second power supply potential capable of being maintained in an active state even if the first power supply potential is set in an inactive state, and drives an output node in accordance with the first internal signal. The interface circuit includes a first level conversion circuit and a driving section. The first level conversion circuit includes: a first holding circuit holding one of a first logical value and a second logical value complementary to the first logical value; a first write circuit writing one of the first and second logical values to the first holding circuit in accordance with the first internal signal; and a second write circuit writing the second logical value to the first holding circuit in accordance with an enable signal. The driving section drives the output node if the first holding circuit holds the first logical value, and turns into a high impedance state with respect to the output node if the first holding circuit holds the second logical value.

According to another aspect of the present invention, this invention provides a semiconductor device which includes an internal circuit and an interface section.

The internal circuit receives a first power supply potential as an operating power supply potential, and outputs an internal signal. The internal circuit includes a first pulse generation circuit activating the internal signal for a predetermined period in accordance with transition of a data signal. The interface circuit receives, as the operating power supply potential, a second power supply potential capable of being maintained in an active state even if the first power supply potential is set in an inactive state, and drives an output node in accordance with the internal signal. The interface circuit includes a first level conversion circuit and a driving section. The first level conversion circuit includes: a holding circuit holding one of a first logical value and a second logical value complementary to the first logical value; and a write circuit writing one of the first and second logical values to the holding circuit in accordance with the internal signal. The driving section drives the output node if the holding circuit holds the first logical value, and turns into a high impedance state with respect to the output node if the holding circuit holds the second logical value.

According to yet another aspect of the present invention, this invention provides a semiconductor device which includes a core section and an interface section.

The core section receives, as operating power supply potentials, a first power supply potential and a second power supply potential, the second power supply potential capable of being maintained in an active state even if the first power supply potential is set in an inactive state. The core section includes a first internal circuit and a second internal circuit. The first internal circuit receives the first power supply potential as the operating power supply potential, and outputs an internal signal. The second internal circuit operates in accordance with the internal signal. The second internal circuit includes a level conversion circuit converting a logical amplitude of the internal signal. The level conversion circuit includes: a holding circuit holding one of a first logical value and a second logical value complementary to the first logical value; and a write circuit writing one of the first and second logical values to the holding circuit in accordance with the internal signal. The interface circuit receives a third power supply potential as the operating power supply potential, and mediates data communication between the core section and an outside of the semiconductor device.

According to still another aspect of the present invention, this invention provides a semiconductor device which includes an internal circuit and an interface section.

The internal circuit receives a first power supply potential as an operating power supply potential, and outputs an internal signal. The interface circuit receives, as the operating power supply potential, a second power supply potential capable of being maintained in an active state even if the first power supply potential is set in an inactive state, and drives an output node in accordance with the internal signal. The interface circuit includes: a level conversion circuit converting level of the internal signal, and a driving section. The level conversion circuit includes: a level conversion section converting the level of a signal received at an input, and outputting the level-converted signal; and an input signal switching section applying the internal signal to the input of the level conversion section when a mode setting signal is active, feeding back an output of the level conversion section to the input of the level conversion section and separating the internal signal from the input of the level conversion section when the mode setting signal is inactive. The driving section drives the output node if the output of the level conversion circuit corresponds to a first logical value, and turns into a high impedance state with respect to the output node if the output of the level conversion circuit corresponds to a second logical value.

Therefore, the main advantage of the present invention is in that even if the power supply of the internal circuit is shut down for reducing consumption power while the output node outputs H level or L level, the output state of the output node can be maintained and the output node can be then set in a high impedance state. As a result, a bus or the like connected to the output node can be released.

Another advantage of the present invention is in that if the output node is set in a high impedance state, it is possible to prevent the competition of potentials between the nodes due to the slow falling rate of the potential of an input signal into each level shift circuit, to prevent penetrating current and to thereby ensure stable operation.

Yet another advantage of the present invention is in that even if the lower power supply potential out of a plurality of power supply potentials employed in the core section is shut down for reducing consumption power while each level shift circuit outputs H level or L level, the level shift circuit holds data and the output of the output node does not become unstable.

Still another advantage of the present invention is in that if the power supply of the internal circuit is shut down, an input signal into each level shift circuit is separated from an output from the internal circuit. Due to this, inverted data is not set to the level shift circuit by the influence of noise and the like. In addition, since no pulses are generated, delay circuits become unnecessary, whereby the number of constituent elements and consumption power can be greatly decreased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
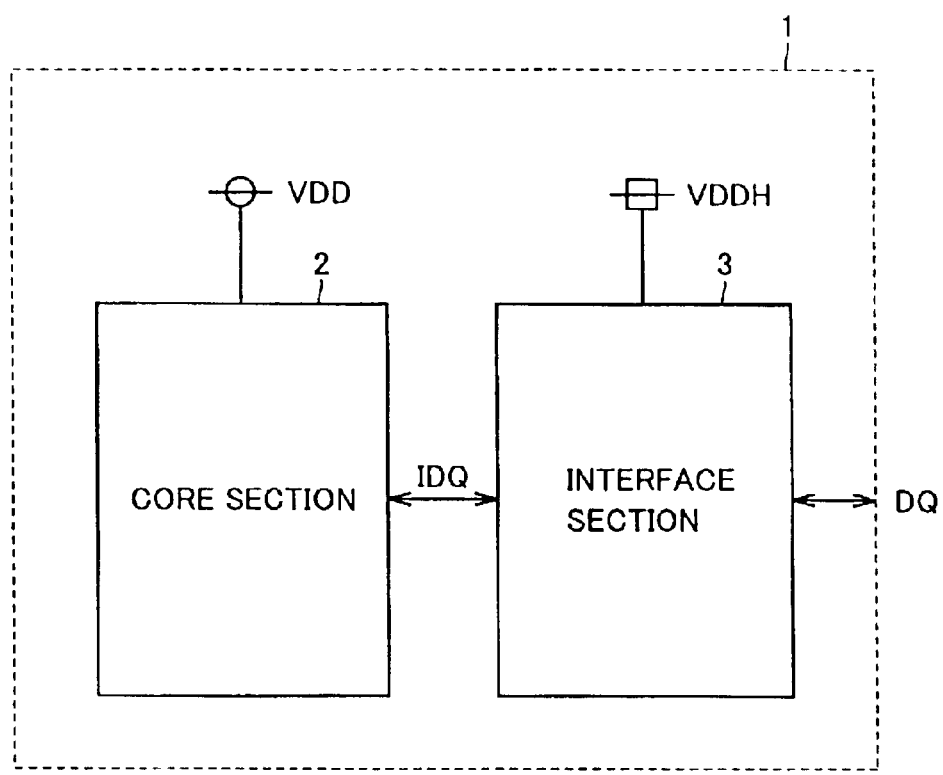
FIG. 1 is a block diagram showing the configuration of a semiconductor device 1 in the first embodiment according to the present invention.

FIG. 1 is a block diagram showing the configuration of semiconductor device 1 in the first embodiment according to the present invention.

Referring to FIG. 1, semiconductor device 1 includes an interface section 3 which transmits and receives a signal DQ to and from the other device through a data bus or the like, and a core section 2 which transmits and receives an internal signal IDQ to and from interface section 3.

Interface section 3 receives power supply potential VDDH as an operating power supply potential. Core section 2 receives power supply potential VDD as an operating power supply potential. Power supply potentials VDDH and VDD may be directly supplied from the outside of semiconductor device 1 or a power supply circuit which receives power supply potential VDDH from the outside of semiconductor device 1 and which generates power supply potential VDD inside thereof may be included in semiconductor device 1.

Figure 2:
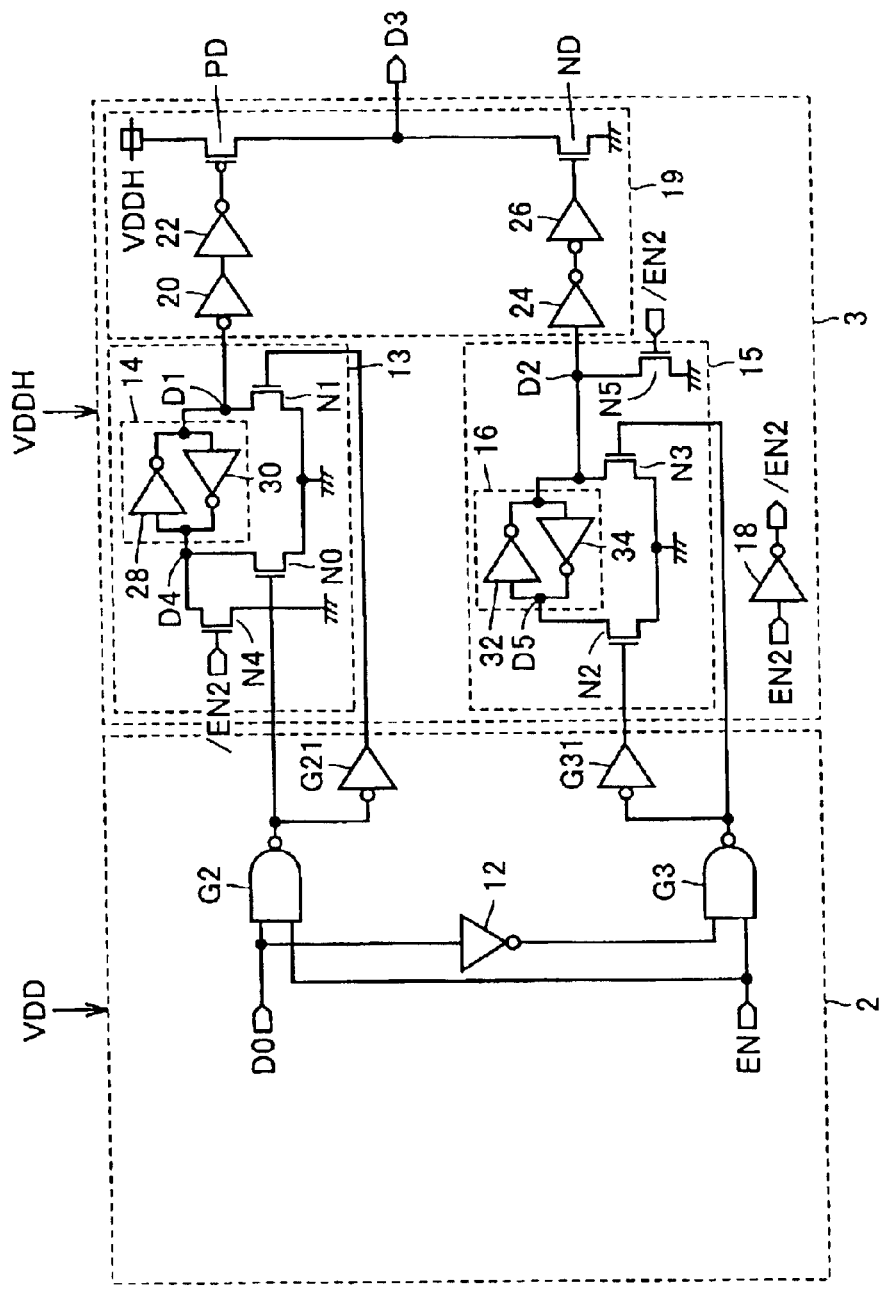
FIG. 2 is a circuit diagram showing a connection section between a core section 2 and an interface section 3 shown in FIG. 1.

FIG. 2 is a circuit diagram showing a connection section between core section 2 and interface section 3 shown in FIG. 1.

Referring to FIG. 2, core section 2 receives power supply potential VDD as an operating power supply potential, and includes a NAND circuit G2 which receives signal D0 and enable signal EN, an inverter G21 which receives and inverts the output of NAND circuit G2, an inverter 12 which receives and inverts signal D0, a NAND circuit G3 which receives the output of inverter 12 and signal EN, and an inverter G31 which receives and inverts the output of NAND circuit G3.

Interface section 3 receives power supply potential VDDH as an operating power supply potential, and includes an inverter 18 which receives and inverts an output enable signal EN2 and which outputs a signal/EN2, a level shift circuit 13 which holds predetermined data in accordance with the outputs of NAND circuit G2 and inverter G21 and signal/EN2, a level shift circuit 15 which holds predetermined data in accordance with the outputs of NAND circuit G3 and inverter G31 and signal/EN2, and a driving section 19 which drives output node D3 in accordance with the data held in level shift circuits 13 and 15.

Level shift circuit 13 includes an N-channel MOS transistor N4 which is connected between a node D4 and a ground node and which has a gate receiving signal/EN2, an N-channel MOS transistor N0 which is connected between node D4 and the ground node and which has a gate receiving the output of NAND circuit G2, and an N-channel MOS transistor N1 which is connected between a node D1 and the ground node and which has a gate receiving the output of inverter G21.

Level shift circuit 13 also includes a latch circuit 14. Latch circuit 14 includes an inverter 28 which has an input connected to node D4 and an output connected to node D1, and an inverter 30 which has an input connected to node D1 and an output connected to node D4.

Level shift circuit 15 includes an N-channel MOS transistor N5 which is connected between a node D2 and a ground node and which has a gate receiving signal/EN2, an N-channel MOS transistor N3 which is connected between node D2 and the ground node and which has a gate receiving the output of NAND circuit G3, and an N-channel MOS transistor N2 which is connected between a node D5 and the ground node and which has a gate receiving the output of inverter G31.

Level shift circuit 15 also includes a latch circuit 16. Latch circuit 16 includes an inverter 32 which has an input connected to node D5 and an output connected to node D2, and an inverter 34 which has an input connected to node D2 and an output connected to node D5.

Driving section 19 includes an inverter 20 which has an input connected to node D1, an inverter 22 which receives and inverts the output of inverter 20, and a P-channel MOS transistor PD which is connected between a node applied with power supply potential VDDH and output node D3 and which has a gate receiving the output of inverter 22.

Driving section 19 also includes an inverter 24 which has an input connected to node D2, an inverter 26 which receives and inverts the output of inverter 24, and an N-channel MOS transistor ND which is connected between output node D3 and a ground node and which has a gate receiving the output of inverter 26.

The differences of the semiconductor device in the first embodiment and the conventional technique will next be described.

There may be cases where the control signal line should be released to yet another device after a state in which the semiconductor device controls the other device, i.e., H level or L level is supplied to the other device through the control signal line for a predetermined period. According to the conventional technique, the output node cannot be set in a high impedance state in these cases. This is because the interface section cannot recognize output enable signal EN when power supply potential VDD of the core section is shut down.

According to the first embodiment, by contrast, the interface circuit which can be set in a high impedance state even after the power supply of the core section is shut down, is provided.

Figure 21:
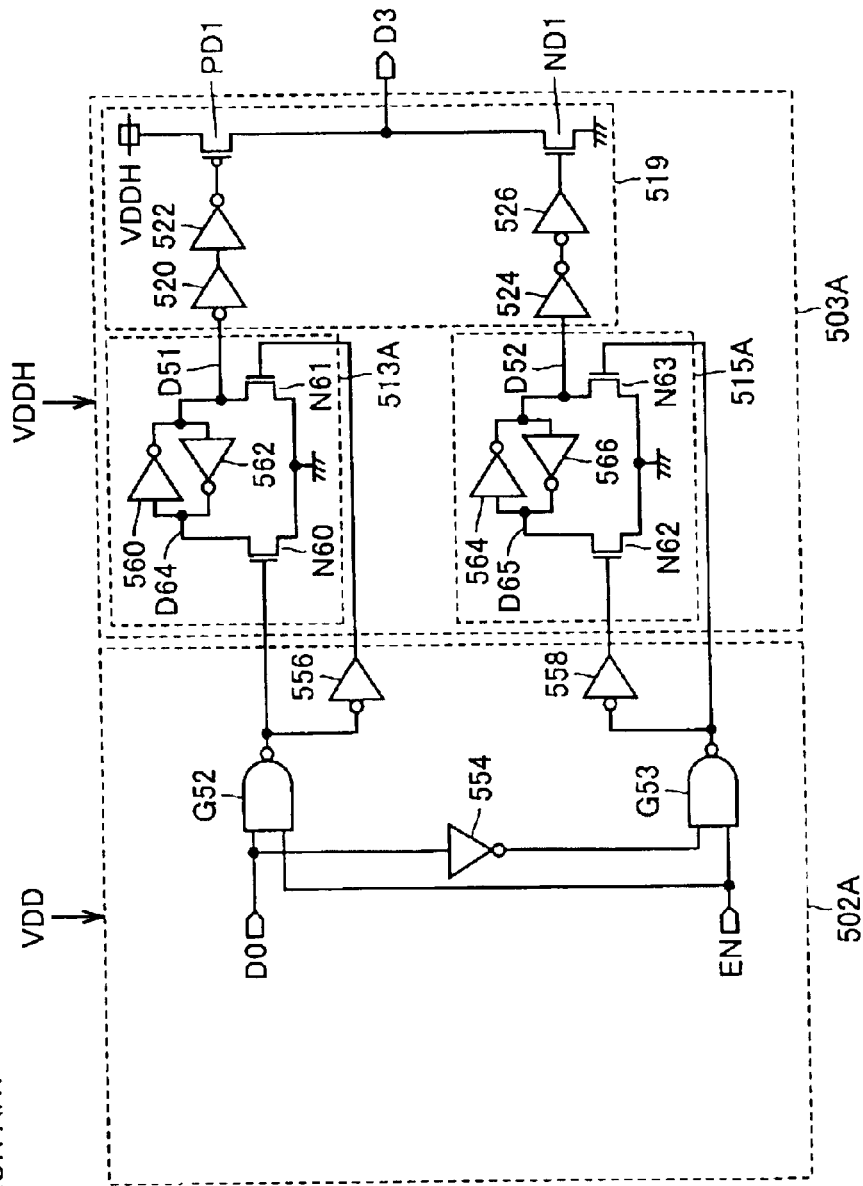
FIG. 21 is a circuit diagram showing a conventional technique for providing level shift circuit sections with latch functions, respectively.

The circuit configuration shown in FIG. 2 differs from that shown in FIG. 21 which shows the conventional technique in the following respects. Output enable signal EN2 which can be directly set from the outside of the semiconductor device is newly used for control. It is assumed that if output enable signal EN2 is at H level, output node D3 is set in an output enable state and if output enable signal EN2 is at L level, output node D3 is set in a high impedance state as in the case of output enable signal EN used in the conventional technique.

The input buffer of signal EN2 (inverter 18) is arranged to receive power supply potential VDDH of interface section 3 as an operating power supply potential. The amplitude of inverted signal/EN2 of signal EN2 is VDDH. If output node D3 is to be set in a high impedance state, signal EN2 is set at L level. Inverted signal/EN2 of signal EN2 becomes H level, accordingly.

In level shift circuit 13 on an output transistor PD side, N-channel MOS transistor N4 is turned on, node D4 is set at L level and node D1 is set at H level. Output transistor PD is, therefore, turned off.

In level shift circuit 15 on an output transistor ND side, N-channel MOS transistor N5 is turned on, node D2 is set at L level and node D5 is set at H level. Output transistor ND is, therefore, turned off. Since the two output transistors of driving section 19 are both turned off, output node D3 turns into a high impedance state.

According to the present invention in the first embodiment, even if the power supply of the core section is shut down for decreasing consumption power, an output state in which the output node outputs H level (VDDH) or L level (GND) can be maintained, and the output node can be then set in a high impedance state. It is, therefore, possible to release a bus connected to the output node.
(Second Embodiment)

According to the first embodiment shown in FIG. 2, if H level, for example, is outputted from output node D3, node D1 of level shift circuit 13 is set at L level and the gate of N-channel MOS transistor N1 thereof is set at H level. The gate of N-channel MOS transistor N1 is driven by inverter G21 and is not directly connected to power supply potential VDD.

If the power supply of the core section is shut down, power supply potential VDD suddenly falls to 0V. The gate of transistor N1, however, does not have a path directly connected to the power supply node. In this state, the fall of the gate potential of transistor N1 is carried out by discharging transistor N1 by leak current thereof.

This leak current is normally very small in quantities and the potential change of the gate of transistor N1 is quite slow. If the output node is set in an output high impedance mode (EN2=L level) before the gate potential of transistor N1 is sufficiently decreased, N-channel MOS transistor N4 is turned on to thereby forcedly discharge the charges of node D4.

As a result, both of nodes D1 and D4 are set at L level and a problem that penetrating current flows in two inverters 28 and 30 which constitute latch circuit 14 may, therefore, possibly occur.

The second embodiment is intended to prevent penetrating current from flowing in level shift circuits if the output node is changed from a state in which H or L level is outputted from the output node to a high impedance state after the power supply of the core section is shut down.

Figure 3:
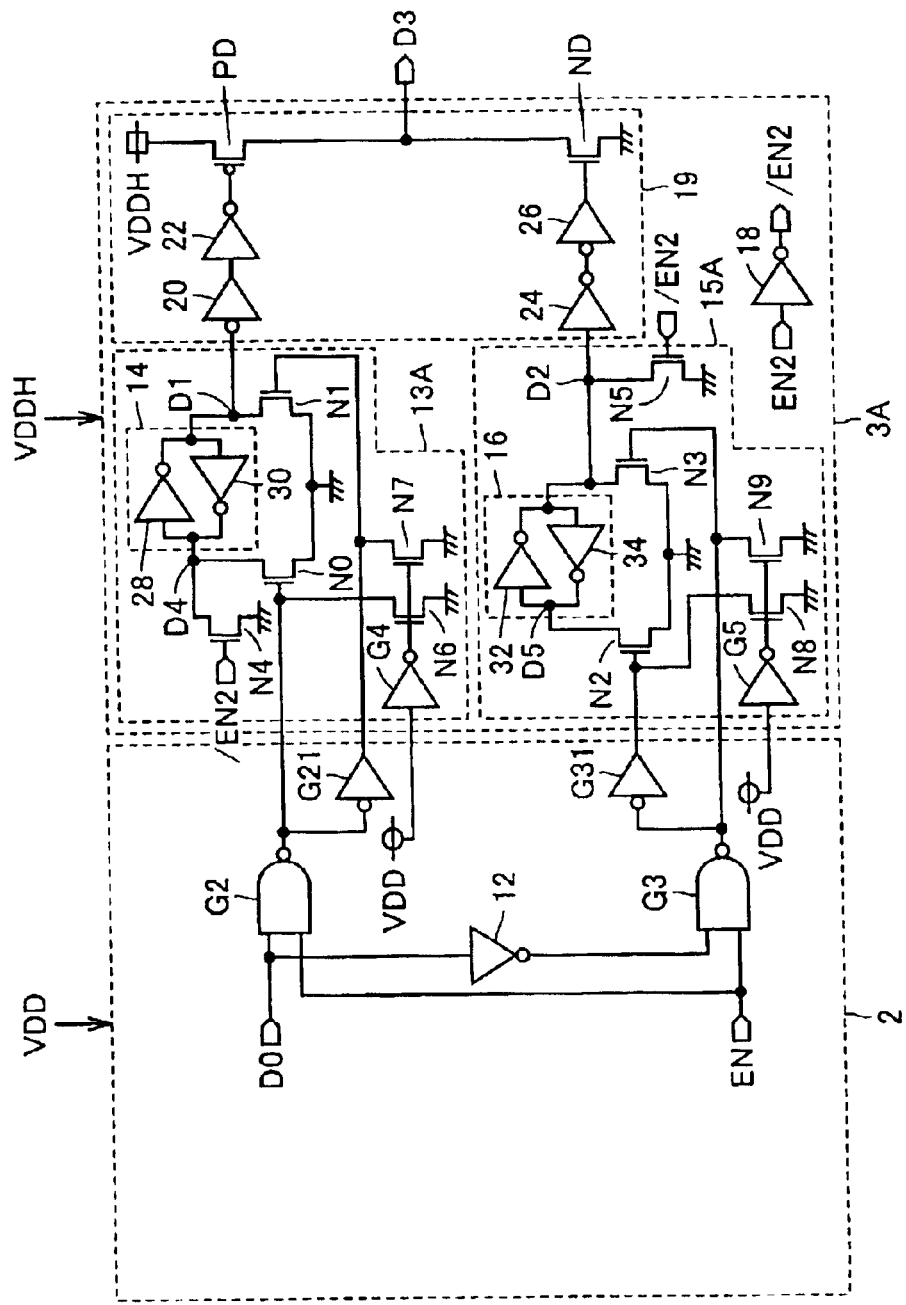
FIG. 3 is a circuit diagram showing a connection section between a core section and an interface section of a semiconductor device in the second embodiment.

FIG. 3 is a circuit diagram showing a connection section between a core section and an interface section in a semiconductor device in the second embodiment.

Referring to FIG. 3, the semiconductor device in the second embodiment includes an interface section 3A in place of interface section 3 provided in the configuration of semiconductor device 1 in the first embodiment shown in FIG. 2.

Interface section 3A includes level shift circuits 13A and 15A in place of level shift circuits 13 and 15 in the configuration of interface section 3 shown in FIG. 3, respectively.

Level shift circuit 13A includes not only the constituent elements of level shift circuit 13 shown in FIG. 2 but also an inverter G4 which has an input applied with power supply potential VDD, an N-channel MOS transistor N6 which is connected between the gate of N-channel MOS transistor N0 and a ground node and which has a gate receiving the output of inverter G4, and an N-channel MOS transistor N7 which is connected between the gate of N-channel MOS transistor N1 and the ground node and which has a gate receiving the output of inverter G4.

Level shift circuit 15A includes not only the constituent elements of level shift circuit 15 shown in FIG. 2 but also an inverter G5 which has an input applied with power supply potential VDD, an N-channel MOS transistor N8 which is connected between the gate of N-channel MOS transistor N2 and a ground node and which has a gate receiving the output of inverter G5, and an N-channel MOS transistor N9 which is connected between the gate of N-channel MOS transistor N3 and the ground node and which has a gate receiving the output of inverter G5.

Power supply potential VDDH of interface section 3A is applied to inverters G4 and G5 as operating power supply potentials.

Since the remaining constituent elements of interface section 3A are the same as those of interface section 3 shown in FIG. 2, they will not be repeatedly described herein.

A case where H level is outputted from output node D3 will be considered in the circuits shown in FIG. 3. Node D1 of level shift circuit 13A is at L level and the gate of N-channel MOS transistor N1 thereof is at H level. In this state, if the power supply of core section 2 is shut down, power supply potential VDD rapidly falls to 0V. Namely, the input of inverter G4 becomes L level and N-channel MOS transistors N6 and N7 are turned on. While the potential fall of the gate of transistor N1 is quite slow in the first embodiment, the potential change of the gate of N1 is fast due to the forced discharge of the gate of transistor N1 by transistor N7 in the second embodiment.

Accordingly, even if output node D3 in an output active state is then set in an output high impedance mode (EN2=L level), transistor N1 is swiftly set to be turned off, so that both of nodes D1 and D4 are not set at L level at the same time. As a result, it is possible to prevent penetrating current from flowing in two inverters 28 and 30 which constitute latch circuit 14.

Here, N-channel MOS transistor N6 is provided to prevent N-channel MOS transistor N0 from being turned on by noise and the like while power supply potential VDD of core section 2 is shut down. Level shift circuit 15A performs the same operation as that of level shift circuit 13A, thereby preventing penetrating current from flowing in latch circuit 16.

According to the present invention in the second embodiment, after the power supply of the core section is shut down for decreasing consumption power while H level (VDDH) or L level (GND) is outputted from the output node, it is possible to release a bus connected to the output node. In addition, if the output node is set in a high impedance state, it is possible to prevent the potentials from competing with each other between the nodes of each level shift circuit. It is thereby possible to prevent penetrating current and to obtain stable operation accordingly.

(Third Embodiment)

In the second embodiment, inverters G4 and G5 are provided so as to fix the potentials of input signals into the respective level shift circuits after the power supply of the core section is shut down as shown in FIG. 3. The operating power supply potentials of these inverters are VDDH and input level is VDD in normal operation, i.e., while power is supplied to the core section.

However, since the input level (VDD) is lower than power supply potential (VDDH), penetrating current flows in inverters G4 and G5. In addition, if an operation mode is to be promptly returned from a low consumption power mode or the like, the power supply of the core section does not fall to GND level but the semiconductor device is often modified or applied, e.g., the power supply potential of the core section is set at ½VDD in the low consumption power mode. In this case, each logical gate of the core section can output a normal logical operation result for an input signal. Accordingly, if N-channel MOS transistors N6 to N9 are turned on when the low consumption power mode is sensed and the outputs of inverters G4 and G5 both become H level, then the following problem may possibly occur.

In the circuits shown in FIG. 3, a case where H level is outputted from output node D3 will be considered. In this case, even if the power supply potential of the core section is decreased to ½VDD, node D1 of level shift circuit 13A is at L level and the gate potential of N-channel MOS transistor N1 is at H level (=½VDD). Therefore, the competition of current occurs between inverter G21 and N-channel MOS transistor N7, with the result that penetrating current flows.

If L level is outputted from output node D3, penetrating current flows between NAND circuit G2 and N-channel MOS transistor N6. In addition, penetrating current flows in level shift circuit 15A for the same reasons.

According to the present invention in the third embodiment, even if the power supply potential of the core section is not completely shut down to 0V but is decreased to a predetermined potential at which each logical gate of the core section normally operates in a low consumption power mode, it is possible to prevent penetrating current from flowing in the level shift circuits.

Figure 4:
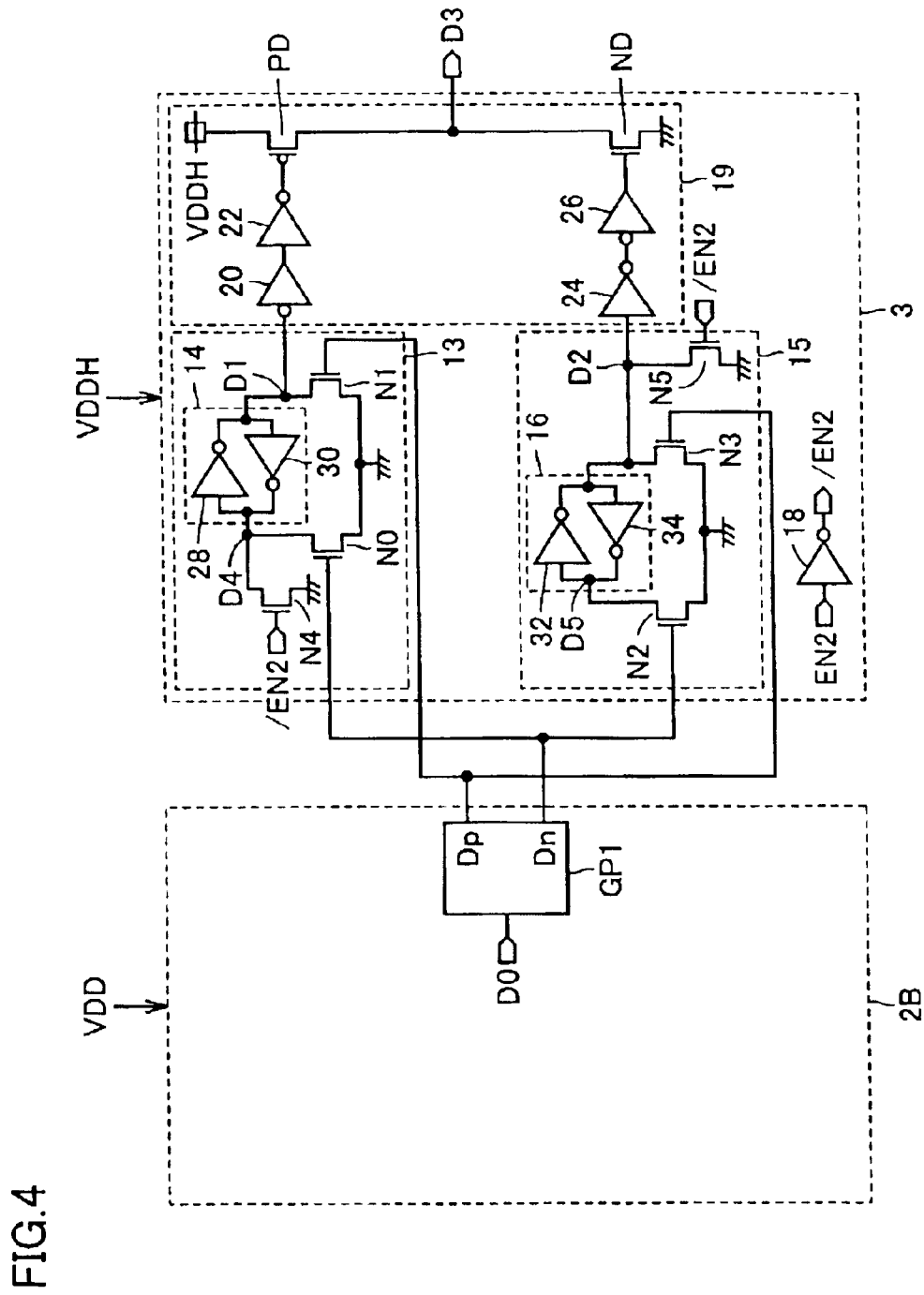
FIG. 4 is a circuit diagram for explaining a boundary section between a core section and an interface section of a semiconductor device in the third embodiment.

FIG. 4 is a circuit diagram for explaining a boundary section between the core section and the interface section of the semiconductor device in the third embodiment.

Referring to FIG. 4, the semiconductor device in the third embodiment differs from that in the first embodiment in that a core section 2B instead of core section 2 in the boundary section shown in FIG. 2 is provided. Core section 2B includes a pulse generator GP1 which receives signal D0 and outputs signals Dp and Dn.

Since the configuration of interface section 3 is the same as that of interface section 3 described with reference to FIG. 2, it will not be repeatedly described herein.

Input signals inputted into respective level shift circuits 13 and 15 are generated in pulse generator GP1. Signal D0 which represents to-be-outputted data is inputted into pulse generator GP1 and two types of output signals, i.e., Dp and Dn are outputted.

Figure 5:
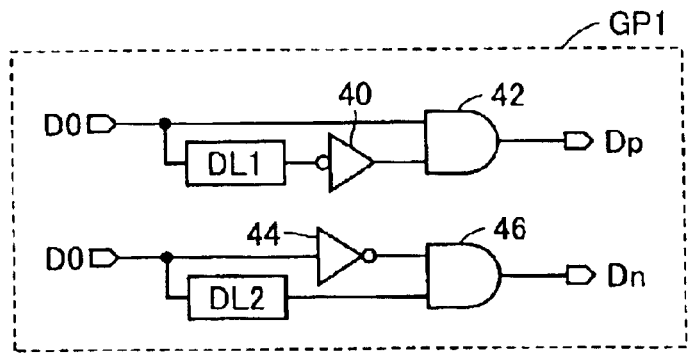
FIG. 5 is a circuit diagram showing the configuration of a pulse generator GP1 shown in FIG. 4.

FIG. 5 is a circuit diagram showing the configuration of pulse generator GP1 shown in FIG. 4.

Referring to FIG. 5, pulse generator GP1 includes a delay circuit DL1 which receives and delays signal D0, an inverter 40 which receives and inverts the output of delay circuit DL1, and an AND circuit 42 which receives signal D0 and the output of inverter 40 and which outputs signal Dp.

Pulse generator GP1 also includes a delay circuit DL2 which receives and delays signal D0, an inverter 44 which receives and inverts signal D0, and an AND circuit 46 which receives the output of inverter 44 and that of delay circuit DL2 and which outputs signal Dn.

It is noted that DL1 and DL2 are delay circuits each having a delay quantity Δt.

Figure 6:
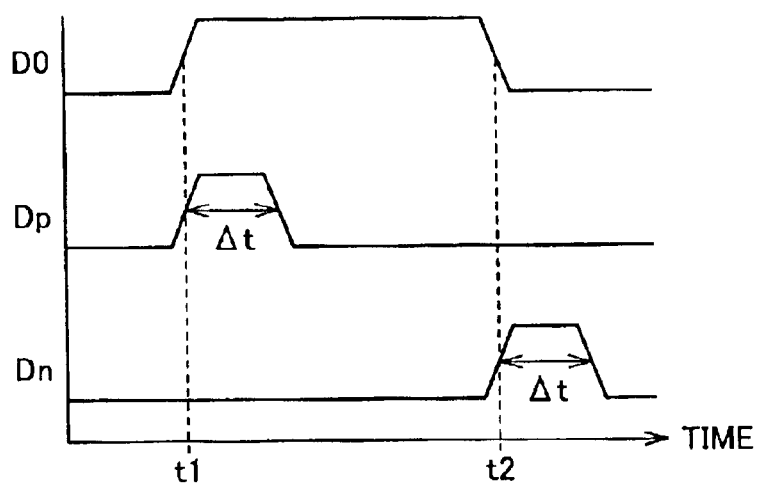
FIG. 6 is an operating waveform view for explaining the operation of pulse generator GP1.

FIG. 6 is an operating waveform view for explaining the operation of pulse generator GP1.

Referring to FIG. 6, the vertical axis indicates voltage and the horizontal axis indicates time. At time t1, when the level of signal D0 changes from H level to L level, a pulse having a time width Δt is generated in signal Dp. Conversely, when the level of signal D0 changes from H level to L level at time t2, a pulse having time width Δt is generated in signal Dn.

Referring to FIGS. 4 and 6, a case where H level is outputted from output node D3 will be considered. The level of signal D0 changes from L level to H level. Accordingly, a pulse having time width Δt is generated in output Dp of pulse generator GP1. In level shift circuit 13, N-channel MOS transistor N1 is kept to be turned on only in period Δt. Time width Δt is set to be sufficiently large to write data to latch circuits 14 and 16 of level shift circuits 13 and 15, respectively. The level of node D1, therefore, becomes L level and output transistor PD becomes conductive. Output node D3 is driven to H level, accordingly.

On the other hand, in level shift circuit 15, N-channel MOS transistor N3 is kept to be turned on only in period Δt. Since node D2 is set at L level, output transistor ND is turned off.

If L level is outputted from output node D3, the level of signal D0 changes from H level to L level. A pulse having time width Δt is generated in output Dn of pulse generator GP1, accordingly. In level shift circuit 13, N-channel MOS transistor N0 is turned on. The level of node D1 becomes H level and output transistor PD is turned off, accordingly. In level shift circuit 15, N-channel MOS transistor N2 is turned on. Node D2 is set at H level, accordingly, so that output transistor ND is turned on. As a result, output node D3 is driven to L level.

The setting of data to latch circuits 14 and 16 of level shift circuits 13 and 15, respectively, by using pulses has the following merits. The levels of input signals into level shift circuits 13 and 15 both become H level only temporarily, i.e., when output data is changed. Since data has normally no change just prior to the shutdown of the power supply potential of the core section, these input signals are set at L level. Therefore, the disadvantage of the first embodiment, i.e., the phenomenon that the change of the levels of the input signals into the level shift circuits from H level to L level is slow when the power supply potential of the core section is shut down, does not occur. Further, penetrating current due to the collision of the signals against external output enable signal EN2 does not occur.

Moreover, such a circuit which fixes the potentials of the input signals after shutting down the power supply of the core section as provided in the second embodiment becomes unnecessary. As a result, the disadvantage of the second embodiment, i.e., penetrating current generated in normal operation or penetrating current generated by the collision of the signals against external output enable signal EN2 if the power supply potential is set higher than GND level in a low consumption power mode, does not occur.

As stated above, according to the present invention in the third embodiment, if the output node is set in a high impedance state after the power supply of the core section is shut down for decreasing consumption power while H level (VDDH) or L level (GND) is outputted from the output node, it is possible to prevent the competition of potentials between the nodes due to the slow fall of the potentials of the input signals into the respective level shift circuits, to prevent penetrating current and to thereby ensure stable operation.

Additionally, since the circuit which fixes the potentials of the input signals after the power supply of the core section is shut down becomes unnecessary, it is possible to prevent penetrating current in normal operation.

Furthermore, it is possible to prevent the competition of potentials between the nodes of each level shift circuit if the power supply potential during the shutdown is set higher than GND level, to prevent penetrating current and to thereby ensure stable operation.

(Fourth Embodiment)

In the third embodiment, the circuit configuration for writing data to the latch circuits of the respective level shift circuits using pulse signals has been shown.

In the fourth embodiment, if level shift circuit sections have such circuit configurations, it is possible to set the output node in a high impedance state in normal operation.

Figure 7:
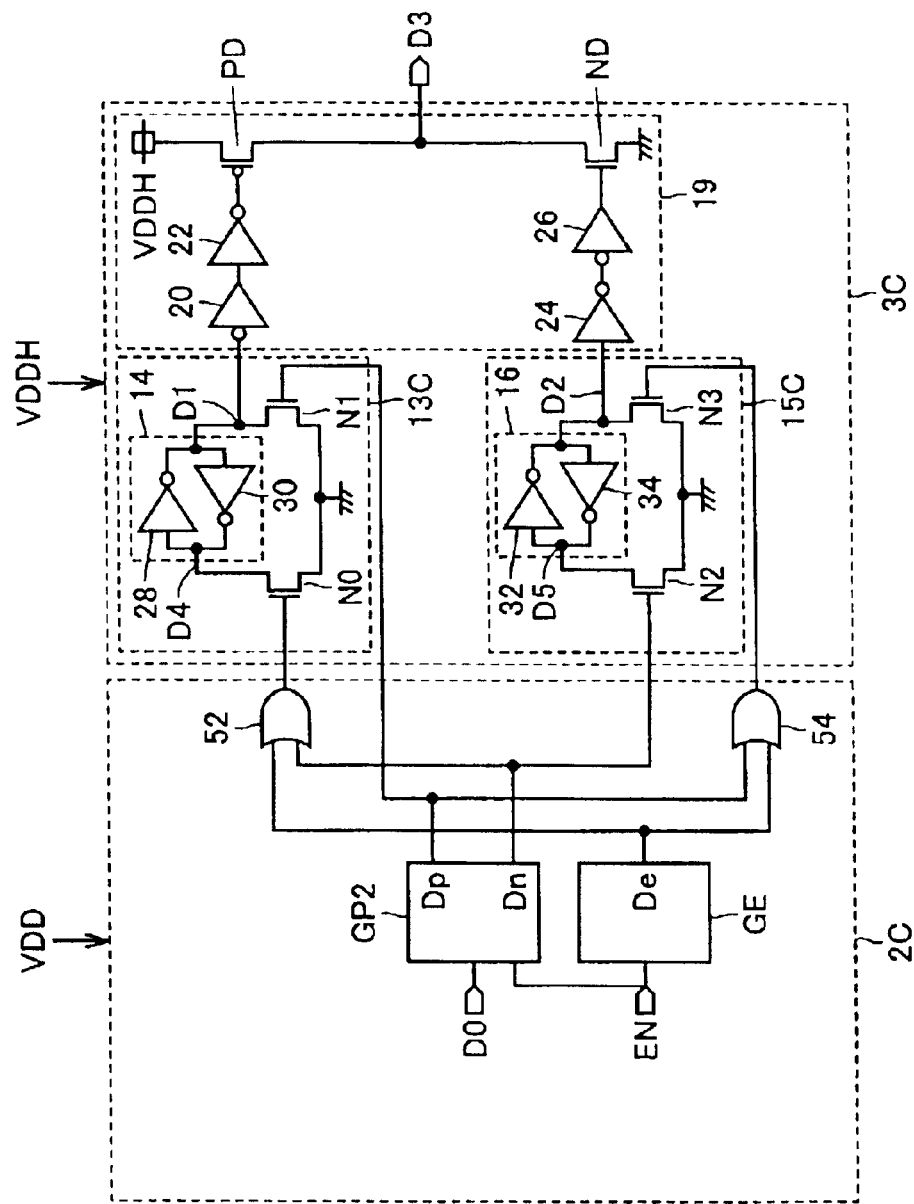
FIG. 7 is a circuit diagram for explaining a connection section between a core section and an interface section in the fourth embodiment.

FIG. 7 is a circuit diagram for explaining a connection section between a core section and an interface section in the fourth embodiment.

Referring to FIG. 7, a core section 2C is a circuit which operates using power supply potential VDD as an operating power supply potential. An interface section 3C is a circuit which operates using power supply potential VDDH as an operating power supply potential.

Core section 2C includes a pulse generator GP2 which outputs signals Dp and Dn in accordance with signals D0 and EN, an output enable detection circuit GE which outputs a signal De in accordance with signal EN, an OR circuit 52 which receives signals De and Dn, and an OR circuit 54 which receives signals Dp and De.

Interface section 3C includes level shift circuits 13C and 15C in place of level shift circuits 13 and 15, respectively, and does not include inverter 18 in the configuration of interface section 3 described with reference to FIG. 2.

Level shift circuit 13C does not include N-channel MOS transistor N4 in the configuration of level shift circuit 13 described with reference to FIG. 2. In addition, the output of OR circuit 52 is applied to the gate of N-channel MOS transistor N0 and signal Dp is applied to the gate of N-channel MOS transistor N1.

Level shift circuit 15C does not include N-channel MOS transistor N5 in the configuration of level shift circuit 15 described with reference to FIG. 2. In addition, signal Dn is applied to the gate of N-channel MOS transistor N2 and the output of OR circuit 54 is applied to the gate of N-channel MOS transistor N3.

In normal operation, core section 2C performs output enable control using signal EN. If signal EN is at L level, output node D3 is set in a high impedance state. Differently from the configuration of the third embodiment shown in FIG. 4, an output enable signal is also inputted into pulse generator GP2. Further, output enable detection circuit GE which detects that the level of signal EN changes to L level and which generates a pulse in a node which outputs signal De, is added.

Figure 8:
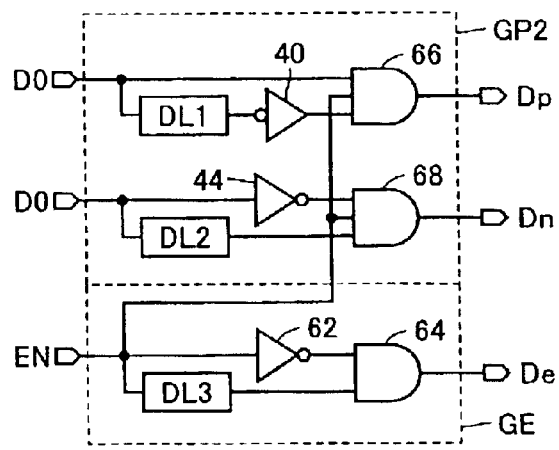
FIG. 8 is a circuit diagram showing the configuration of a pulse generator GP2 and that of an output enable detection circuit GE shown in FIG. 7.

FIG. 8 is a circuit diagram showing the configuration of pulse generator GP2 and that of output enable detection circuit GE shown in FIG. 7.

Referring to FIG. 8, pulse generator GP2 includes 3-input AND circuits 66 and 68 in place of AND circuit 42 and 46, respectively, in the configuration of pulse generator GP1 shown in FIG. 5.

AND circuit 66 receives signal D0, the output of inverter 40 and signal EN and outputs signal Dp.

AND circuit 68 receives the output of inverter 44, the output of a delay circuit DL2 and signal EN and outputs signal Dn.

Output enable detection circuit GE includes a delay circuit DL3 which receives and delays signal EN, an inverter 62 which receives and inverts signal EN, and an AND circuit 64 which receives the output of inverter 62 and that of delay circuit DL3 and which outputs signal De. It is noted that reference symbols DL1 to DL3 denote delay elements, which delay inputted signals by Δt.

In pulse generator GP2, the generation of pulse signals Dp and Dn corresponding to the change of signal D0 when an output is disabled (EN=L level), is prohibited.

Figure 9:
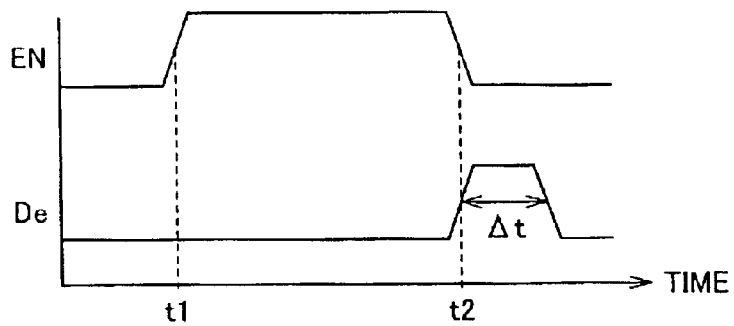
FIG. 9 is an operating waveform view for explaining the operation of output enable detection circuit GE shown in FIG. 8.

FIG. 9 is an operating waveform view for explaining the operation of output enable detection circuit GE shown in FIG. 8.

Referring to FIG. 9, at time t2, output enable detection circuit GE detects that the level of signal EN changes from H level to L level and generates pulse signal De having time width Δt.

Referring back to FIG. 7, the operation of semiconductor device in this embodiment will be explained. In level shift circuit 13C, a logical OR with respect to output Dn of pulse generator GP2 and output De of output enable detection circuit GE is applied to the gate of N-channel MOS transistor N0. As a result, in an output disable state, N-channel MOS transistor N0 is turned off and node D1 is set at H level, accordingly, so that output transistor PD is turned off.

Further, in level shift circuit 15C, a logical OR with respect to output Dp of pulse generator GP2 and output signal De of output enable detection circuit GE is applied to the gate of N-channel MOS transistor N3. As a result, in an output disable state, N-channel MOS transistor N3 is turned on and node D2 is set at L level, accordingly, so that output transistor ND is turned off. Since both of the output transistors are set to be turned off as stated above, the output node turns into a high impedance state.

According to the present invention in the fourth embodiment, the method of setting data to the latch circuits provided in the respective level shift circuits using pulse signals is adopted and timing at which the level of the output enable signal from the core section changes from H level to L level is detected in normal operation. By rewriting data to the latch circuits so that the respective output transistors are turned off by generating pulses according to detected change, it is possible to set the output node in a high impedance state.

(Fifth Embodiment)

There are cases where if the output node is set in a high impedance state, data to be outputted when the output node turns into an output enable state is set in the interface section. When the data to be outputted is set in the interface section, the output node is in an output disable state. Therefore, the change of data does not reflect on the output node. When the output disable state is released, the data which is set in advance should be outputted. The fourth embodiment, however, cannot be used to set data in advance in an output disable state.

That is, the fourth embodiment has a disadvantage in that data cannot be set in the interface section in advance in an output disable state.

Figure 10:
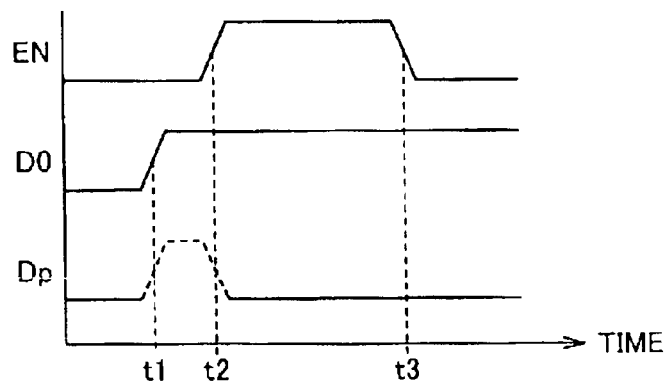
FIG. 10 is an operation waveform view for explaining the disadvantages of the circuits in the forth embodiment.

FIG. 10 is an operating waveform view for explaining the problems of the circuits in the fourth embodiment.

Referring to FIG. 10, in an output disable state (when signal EN is at L level), the level of signal D0 corresponding to data to be outputted changes from L level to H level. However, pulse generator GP2 in the fourth embodiment shown in FIG. 8 generates a pulse in signal Dp as indicated by a broken line of FIG. 10 in an output enable state but does not detect the change of signal D0 when signal EN is at L level. In other words, no pulse is generated in signal Dp. Due to this, even if the output disable state is released, the change of signal D0 does not reflect on output node D3 and L level is outputted from output node D3.

In the fifth embodiment, a method of setting data to latches in respective level shift circuits using pulse signals is adopted and the latest data when an output disable state is released reflects on the output node.

In the fifth embodiment, a pulse generator GP3 in place of pulse generator GP2 shown in FIG. 8 is provided.

Figure 11:
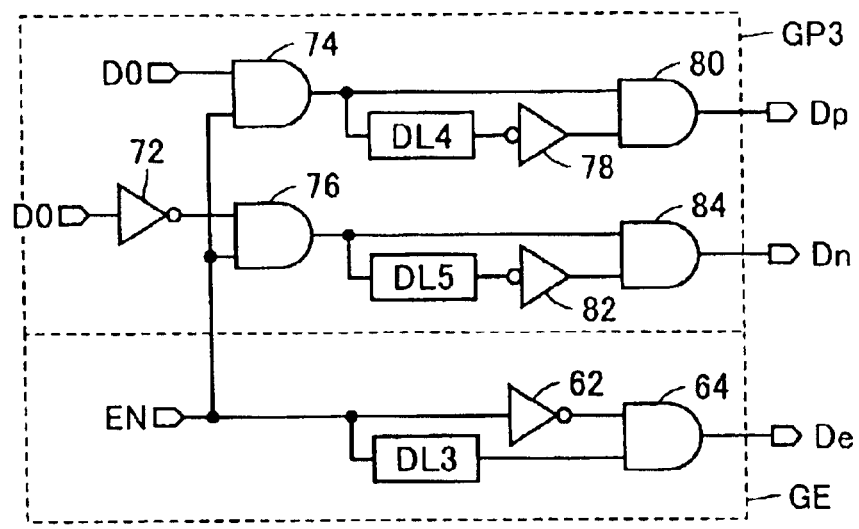
FIG. 11 is a circuit diagram showing the configuration of a pulse generator GP3 and that of output enable detection circuit GE in the fifth embodiment.

FIG. 11 is a circuit diagram showing the configuration of pulse generator GP3 and that of output enable detection circuit GE employed in the fifth embodiment.

Referring to FIG. 11, pulse generator GP3 includes an inverter 72 which receives and inverts signal D0, an AND circuit 74 which receives enable signal EN and signal D0, a delay circuit DL4 which delays the output of AND circuit 74, an inverter 78 which receives and inverts the output of delay circuit DL4, and an AND circuit 80 which receives the output of inverter 78 and that of AND circuit 74 and which outputs signal Dp.

Pulse generator GP3 also includes an AND circuit 76 which receives the output of inverter 72 and signal EN, a delay circuit DL5 which delays the output of AND circuit 76, an inverter 82 which receives and inverts the output of delay circuit DL5, and an AND circuit 84 which receives the output of inverter 82 and that of AND circuit 76 and which outputs signal Dn.

Since the configuration of output enable detection circuit GE is the same as that of output enable detection circuit GE described with reference to FIG. 8, it will not be described repeatedly herein.

Figure 12:
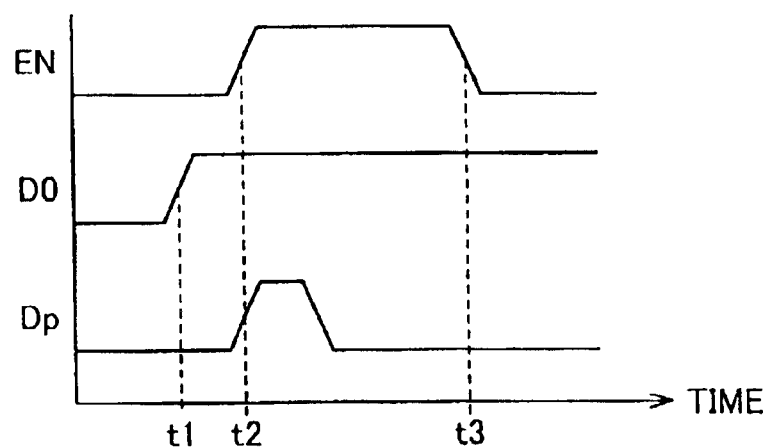
FIG. 12 is an operating waveform view for explaining the operation of pulse generator GP3 in the fifth embodiment.

FIG. 12 is an operating waveform view for explaining the operation of pulse generator GP3 in the fifth embodiment.

Referring to FIG. 12, at time t1, in an output disable state (when signal EN is at L level), the level of signal D0 changes from L level to H level. At this moment, pulse signal Dp is not generated.

At time t2, the level of signal EN becomes H level and the output node turns into an output enable state. At the same time, the latest state of signal D0 is inputted through AND circuits 74 and 76 and pulse signal Dp is generated.

Likewise, if the level of signal D0 changes from H level to L level in the output disable state, pulse signal Dn is generated as soon as the output node turns into an output enable state.

According to the present invention in the fifth embodiment, the method of setting data to latch circuits provided in the respective level shift circuits using pulse signals is adopted and the to-be-outputted data set in an output disable state reflects on the output as soon as the output node turns into an output enable signal. Therefore, it is unnecessary to adjust timing for setting the output node in an output enable state and that for outputting the data with respect to each other, thereby improving operation margin.

(Sixth Embodiment)

In the embodiments described so far, a case where the core section and the interface section use different power supply potentials is assumed. However, there is a probability that a plurality of power supplies are used even in the core section in the future.

If a specific circuit block in the core section determines the operating rate of the entire chip, this circuit block can be accelerated by, for example, increasing the power supply potential of the core section. In the other blocks in the core section which do not require accelerated rate, however, the increase of the power supply potential does not contribute to the improvement of the performances. Besides, the increase of the power supply potential disadvantageously increases consumption power. Considering this, if a high power supply potential is applied only to the rate-determining block in the core section and a lower power supply potential is applied to the other blocks in the core section, for example, it is possible to accelerate the operating rate of the entire chip while minimizing the increase of consumption power.

In the sixth embodiment, a semiconductor device capable of reducing consumption power if a plurality of power supplies are used in the core section, is realized.

Figure 13:
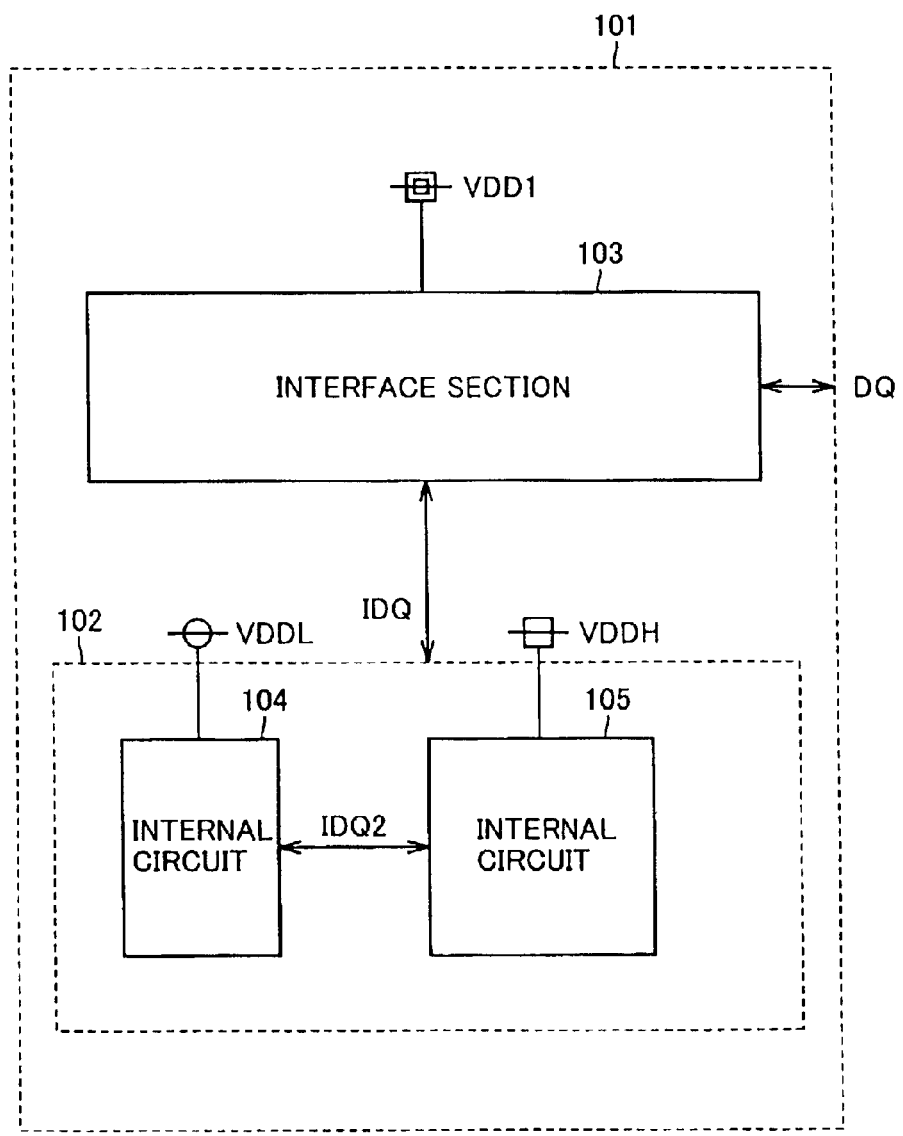
FIG. 13 is a block diagram showing the configuration of a semiconductor device 101 in the sixth embodiment.

FIG. 13 is a block diagram showing the configuration of semiconductor device 101 in the sixth embodiment.

Referring to FIG. 13, semiconductor device 101 includes an interface section 103 which receives a power supply potential VDD1 as an operating power supply potential and which transmits and receives signal DQ to and from the outside of semiconductor device 101, and a core section 102 which receives a plurality of power supply potentials VDDL and VDDH as operating power supply potentials and which transmits and receives a signal IDQ to and from interface section 103. Out of the power supply potentials applied to core section 102, VDDH represents the higher power supply potential and VDDL represents the lower power supply potential.

Core section 102 includes an internal circuit 104 which receives power supply potential VDDL as an operating power supply potential, and an internal circuit 105 which receives power supply potential VDDH as an operating power supply potential and which transmits and receives a signal IDQ2 to and from internal circuit 104.

Internal circuit 105 corresponds to a rate-determining block and internal circuit 104 corresponds to a block the rate of which is not adversely influenced by low power supply potential VDDL.

Figure 14:
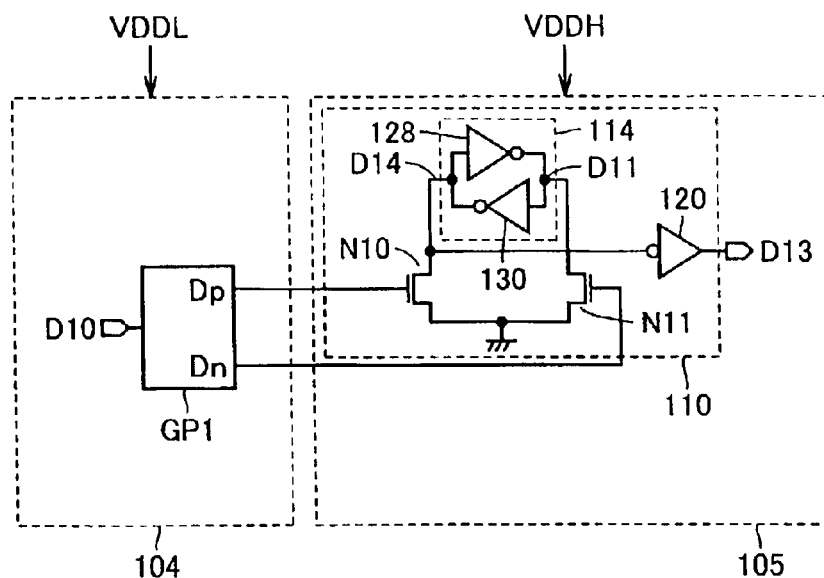
FIG. 14 is a circuit diagram for explaining a connection section between internal circuits 104 and 105.

FIG. 14 is a circuit diagram for explaining a connection section between internal circuits 104 and 105.

Referring to FIG. 14, internal circuit 104 includes pulse generator GP1 which receives a signal D10 and which outputs signals Dp and Dn. Since pulse generator GP1 is equal in configuration to that described with reference to FIG. 5, the configuration thereof will not be repeatedly described herein. Signal D10 represents data transferred from a circuit which operates at power supply potential VDDL to a circuit which operates at power supply potential VDDH.

Internal circuit 105 includes a level shift circuit 110. Level shift circuit 110 includes an N-channel MOS transistor N10 which is connected between a node N14 and a ground node and which has a gate receiving signal Dp, an N-channel MOS transistor N11 which is connected between a node D11 and the ground node and which has a gate receiving signal Dn, a latch circuit 114 which is connected to nodes D11 and D14, and an inverter 120 which has an input connected to node D14 and an output connected to output node D13.

Latch circuit 114 includes an inverter 128 which has an input connected to node D14 and an output connected to node D11, and an inverter 130 which has an input connected to node D11 and an output connected to node D14.

When the level of signal D10 changes from L level to H level, a pulse is generated in signal Dp, N-channel MOS transistor N10 is turned on and node D14 is set at L level. H level is, therefore, outputted to output node D13.

On the other hand, when the level of signal D10 changes from H level to L level, a pulse is generated in signal Dn, N-channel MOS transistor N1 is turned on and node D14 is set at H level. L level is, therefore, outputted to output node D13.

According to the present invention in the sixth embodiment, even if the lower power supply is shut down in the core section for reducing consumption power while a plurality of power supplies are employed in the core section and level shift circuit 110 outputs H level (VDDH) or L level (GND), output data is held in latch circuit 114 of level shift circuit 110. As a result, the output of level shift circuit 110 does not become unstable.

(Seventh Embodiment)

In the sixth embodiment, the present invention is applied to a case of employing a plurality of power supplies in the core section. If a latch circuit is included in a level shift circuit, the level shift circuit can also serve as a pipeline latch.

Figure 15:
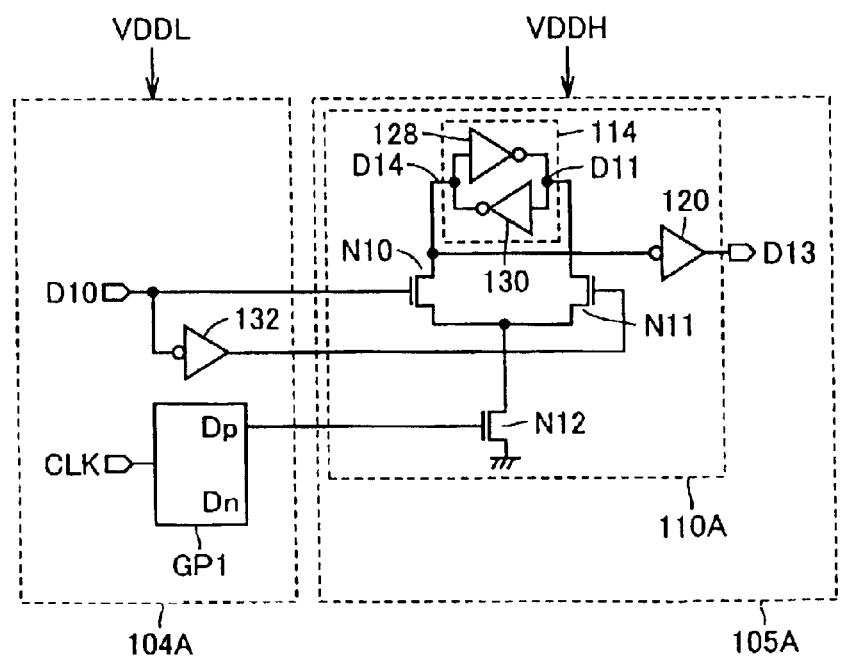
FIG. 15 is a circuit diagram for explaining a connection section between internal circuits 104A and 105A in the seventh embodiment.

FIG. 15 is a circuit diagram for explaining a connection section between an internal circuit 104A and an internal circuit 105A in the seventh embodiment.

Referring to FIG. 15, internal circuit 104A receives power supply potential VDDL as an operating power supply potential. Internal circuit 104A includes an inverter 132 which receives and inverts signal D10, and pulse generator GP1 which receives a clock signal CLK and which outputs signals Dp and Dn. Although pulse generator GP1 differs from that described with reference to FIG. 5 in that pulse generator GP1 receives clock signal CLK in place of signal D0, the internal configuration of pulse generator GP1 is equal to that described with reference to FIG. 5. The configuration thereof will not be, therefore, repeatedly described herein.

Internal circuit 105A receives power supply potential VDDH as an operating power supply potential. Internal circuit 105A includes a level shift circuit 110A in place of level shift circuit 110 in the configuration of internal circuit 105 shown in FIG. 14.

Level shift circuit 110A differs from level shift circuit 110 shown in FIG. 14 in that N-channel MOS transistors N10 and N11 are connected to the ground node through an N-channel MOS transistor N12. Signal Dp outputted from pulse generator GP1 is applied to the gate of N-channel MOS transistor N12. In addition, signal D0 is applied to the gate of N-channel MOS transistor N10 and the output of inverter 132 is applied to the gate of N-channel MOS transistor N11.

Out of a plurality of power supply potentials applied to the core section, VDDH represents the higher power supply potential and VDDL represents the lower power supply potential. Signal D10 represents data transferred from a circuit which operates at power supply potential VDDL to a circuit which operates at power supply potential VDDH.

Clock signal CLK is applied to the gate of N-channel MOS transistor N10 through pulse generator GP1. In pulse generator GP1, when the level of clock signal CLK changes from L level to H level, a pulse is generated in signal Dp.

At this moment, if signal D10 is at H level, N-channel MOS transistor N10 is turned on and node D14 is set at L level. As a result, H level is outputted to output node D13 of level shift circuit 110A.

On the other hand, if signal D0 is at L level, N-channel MOS transistor N1 is turned on and node D14 is set at H level. As a result, L level is outputted to output node D3 of level shift circuit 110A.

As can be seen, an edge trigger type pipeline latch which latches data at the rising edge of clock signal CLK can be constituted. If Dn signal of pulse generator GGP1 is applied to the gate of N-channel MOS transistor N12, an edge trigger type pipeline latch which latches data at the falling edge of clock signal CLK can be constituted.

According to the present invention in the seventh embodiment, even if the lower power supply of the core section is shut down for reducing consumption power while a plurality of power supplies are employed in the core section and the level shift circuit outputs H level (VDDH) or L level (GND), the output data of level shift circuit is held in the latch section of the level shift circuit. Therefore, the output level of the level shift circuit does not become unstable. Further, the level shift circuit can serve as a pipeline latches which latches data when clock signal CLK changes.

(Eighth Embodiment)

In the third to fifth embodiments, if the power supply of the core section is shut down, an input signal into each level shift circuit turns into a high impedance state. Due to this, there is a probability that inverted data is set to the latch circuit included in the level shift circuit by the influence of noise and the like.

In the circuits shown in FIG. 7, for example, if the power supply is applied again to the core section, pulse-like noise is generated in output signals Dp and Dn of pulse generator GP2 and output signal De of output enable detection signal GE by the capacitance coupling between the power supply node and the signal node. There is a probability that erroneous data is set to the latch circuits in respective level shift circuits 13C and 15C, and inverted data is set to output node D3 or output node D3 is set in a high impedance state against the intention, depending on the magnitude of the generated pulse.

Further, in the third to fifth embodiments, delay circuits DL's are employed to generate pulses. To ensure operation under the worst conditions (for operating temperature and power supply potential), it is necessary to secure sufficiently large pulse width, i.e., sufficiently long delay time.

A delay circuit is normally constitute out of a plurality of inverters connected in series. However, 20 to 30 inverters are required so as to realize delay time of 2 to 3 nanoseconds, so that the number of constituent elements disadvantageously increases and consumption power disadvantageously increases.

In the eighth embodiment, by contrast, by separating an input signal into a level shift circuit from the core section when necessary, malfunction caused by the noise stated above is prevented. In addition, since no delay element is employed, it is possible to minimize the increase of the number of constituent elements and that of consumption power.

Figure 16:
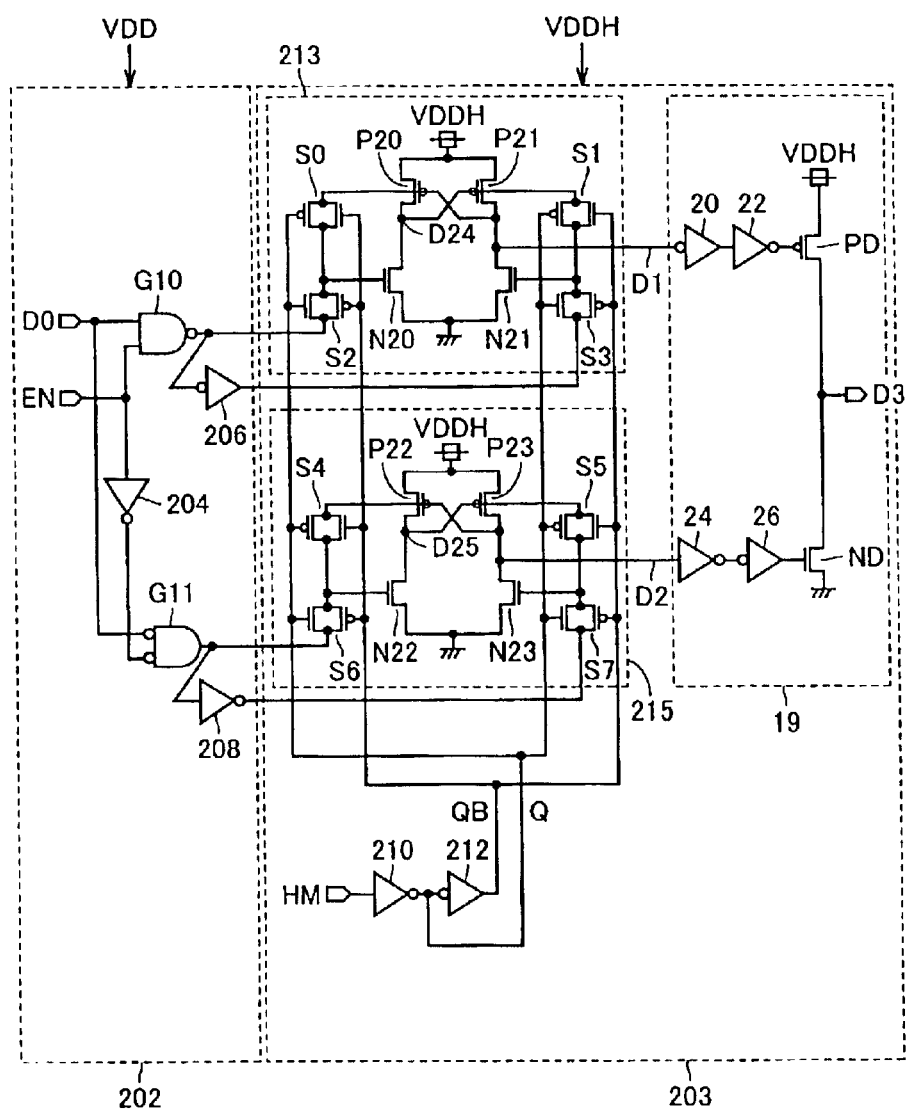
FIG. 16 is a circuit diagram for explaining a connection section between a core section and an interface section of a semiconductor device in the eighth embodiment.

FIG. 16 is a circuit diagram for explaining a connection section between a core section and an interface section in a semiconductor device in the eighth embodiment.

Referring to FIG. 16, a core section 202 is a circuit which receives power supply potential VDD as an operating power supply potential. Core section 202 includes a NAND circuit G10 which receives signals D0 and EN, an inverter 206 which receives and inverts the output of NAND circuit G10, an inverter 204 which receives and inverts signal EN, a NOR circuit G11 which receives the output of inverter 204 and signal D0, and an inverter 208 which receives and inverts the output of NOR circuit G1.

An interface section 203 is a circuit which receives power supply potential VDDH as an operating power supply potential. Interface section 203 includes an inverter 210 which receives and inverts a signal HM applied form the outside of the semiconductor device and which outputs a signal Q, an inverter 212 which receives and inverts the output of inverter 210 and which outputs a signal QB, level shift circuits 213 and 215, and driving section 19 which drives output node D3 in accordance with data held in level shift circuits 213 and 215.

Level shift circuit 213 includes transmission gates S0 to S3, a P-channel MOS transistor P20 which is connected between a node applied with power supply potential VDDH and a node D24 and which has a gate connected to node D1, an N-channel MOS transistor N20 which is connected between node D24 and a ground node, a P-channel MOS transistor P21 which is connected between the node applied with power supply potential VDDH and node D1 and which has a gate connected to node D24, and an N-channel MOS transistor N21 which is connected between node D1 and the ground node.

Transmission gates S0 to S3 are opened and closed in accordance with signal Q outputted from inverter 210 and signal QB outputted from inverter 212.

Transmission gate S2 transmits the output of NAND circuit G10 to the gate of N-channel MOS transistor N20 if signal Q is at H level and signal QB is at L level. Transmission gate S0 becomes conductive and connects node D1 to the gate of N-channel MOS transistor N20 if signal Q is at L level and signal QB is at H level.

Transmission gate S3 transmits the output of inverter 206 to the gate of N-channel MOS transistor N21 if signal Q is at H level and signal QB is at L level. Transmission gate S1 becomes conductive and connects node D24 to the gate of N-channel MOS transistor N21 if signal Q is at L level and signal QB is at H level.

Level shift circuit 215 includes transmission gates S4 to S7, a P-channel MOS transistor P22 which is connected between the node applied with power supply potential VDDH and a node D25 and which has a gate connected to node D2, an N-channel MOS transistor N22 which is connected between node D25 and a ground node, a P-channel MOS transistor P23 which is connected between the node applied with power supply potential VDDH and node D2 and which has a gate connected to node D25, and an N-channel MOS transistor N23 which is connected between node D2 and the ground node.

Transmission gates S4 to S7 are opened and closed in accordance with signal Q outputted from inverter 210 and signal QB outputted from, inverter 212.

Transmission gate S6 transmits the output of NOR circuit G11 to the gate of N-channel MOS transistor N22 if signal Q is at H level and signal QB is at L level. Transmission gate S4 becomes conductive and connects node D2 to the gate of N-channel MOS transistor N22 if signal Q is at L level and signal QB is at H level.

Transmission gate S7 transmits the output of inverter 208 to the gate of N-channel MOS transistor N23 if signal Q is at H level and signal QB is at L level. Transmission gate S5 becomes conductive and connects node D25 to the gate of N-channel MOS transistor N23 if signal Q is at L level and signal QB is at H level.

Figure 20:
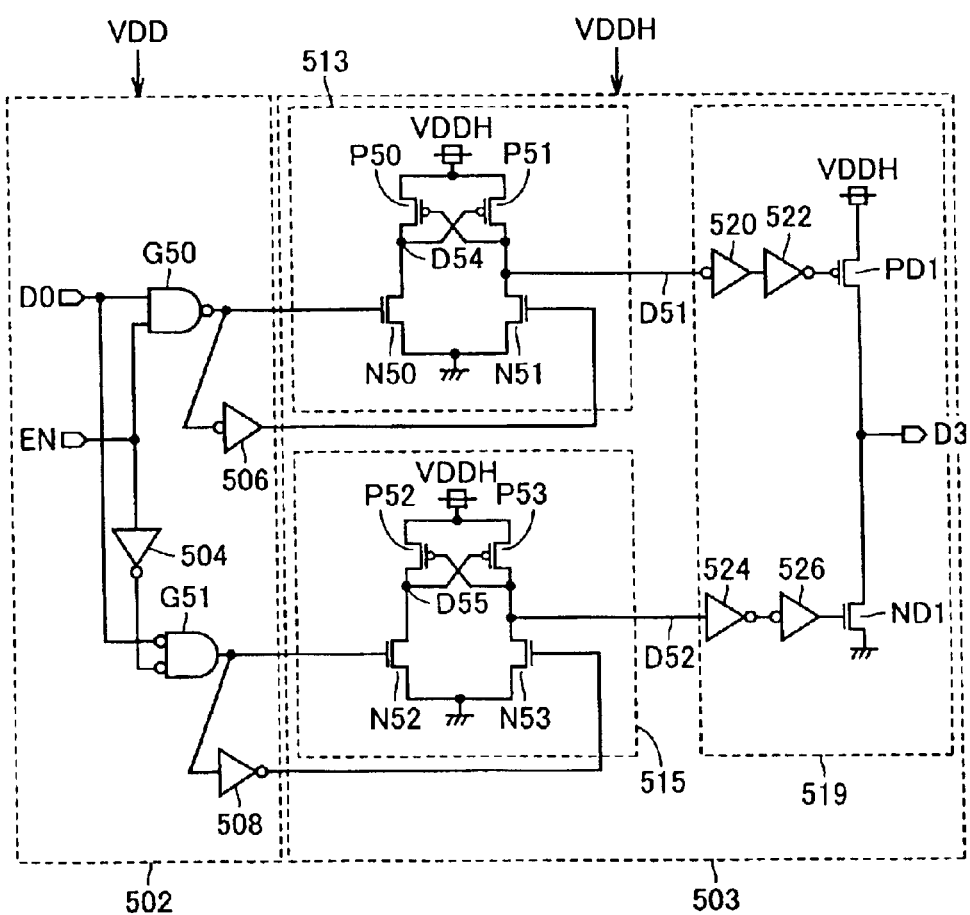
FIG. 20 is a circuit diagram for explaining level shift sections arranged in a connection section between two circuit blocks having different power supply potentials, respectively.

The differences in operation of the eighth embodiment from the third to fifth embodiments are as follows. A signal inputted into each level shift circuit is not a pulse but a constant value as in the case of the first ad second embodiments. Mode select signal HM is a signal which selects the function of each level shift circuit. If mode select signal HM is at L level, each of level shift circuits 213 and 215 performs normal operation as in the case of the conventional technique shown in FIG. 20. If mode select signal HM is at H level, each of level shift circuits 213 and 215 performs data latch operation.

The gate potentials of N-channel MOS transistors N20 and N21 are set according to the switching of transmission gates S0 to S3.

If mode select signal HM is at L level, transmission gates S2 and S3 are turned on. Level shift circuit 213 receives to-be-outputted data from core section 202 and performs level converting operation.

If mode select signal HM is at H level, transmission gates S0 and S1 are turned on. The potential of node D1 is applied to the gate of N-channel MOS transistor N20 and the potential of node D24 is applied to the gate of N-channel MOS transistor N21. Namely, the inverter which consists of P-channel MOS transistor P20 and N-channel MOS transistor N20, is cross-connected to the inverter which consists of P-channel MOS transistor P21 and N-channel MOS transistor N21, thereby constituting a latch.

Level shift circuit 215 performs the same operation as that of level shift circuit 213.

Here, mode select signal HM is inputted to an interface section 203 side which receives power supply potential VDDH. This is intended to hold mode select information even after the power supply of the core section is shut down.

The shutdown of the power supply of the core section is performed in a predetermined order. First, an operation mode is changed from a level shift operation (HM=L level) mode to a latch operation (HM=H level) mode and then the power supply of the core section is shut down.

When the power supply is applied again to the core section, the operation mode is changed from the latch operation (HM=H level) to the level shift operation (HM=L level) after the power supply is applied to the core section.

According to the present invention in the eighth embodiment, if the power supply of the core section is shut down, an input signal into each level shift circuit is separated from the core section and inverted data is not, therefore, set by the influence of noise and the like. Furthermore, since no pulses are generated, delay circuits become unnecessary and the number of constituent elements and consumption power can be greatly decreased.

(Ninth Embodiment)

In the eighth embodiment, the operation of each level shift circuit as a level converter and that as a latch are set by mode select signal HM applied from the outside of the semiconductor device. In the ninth embodiment, by automatically selecting an operation mode, the number of input pins is decreased and control operation is simplified.

Figure 17:
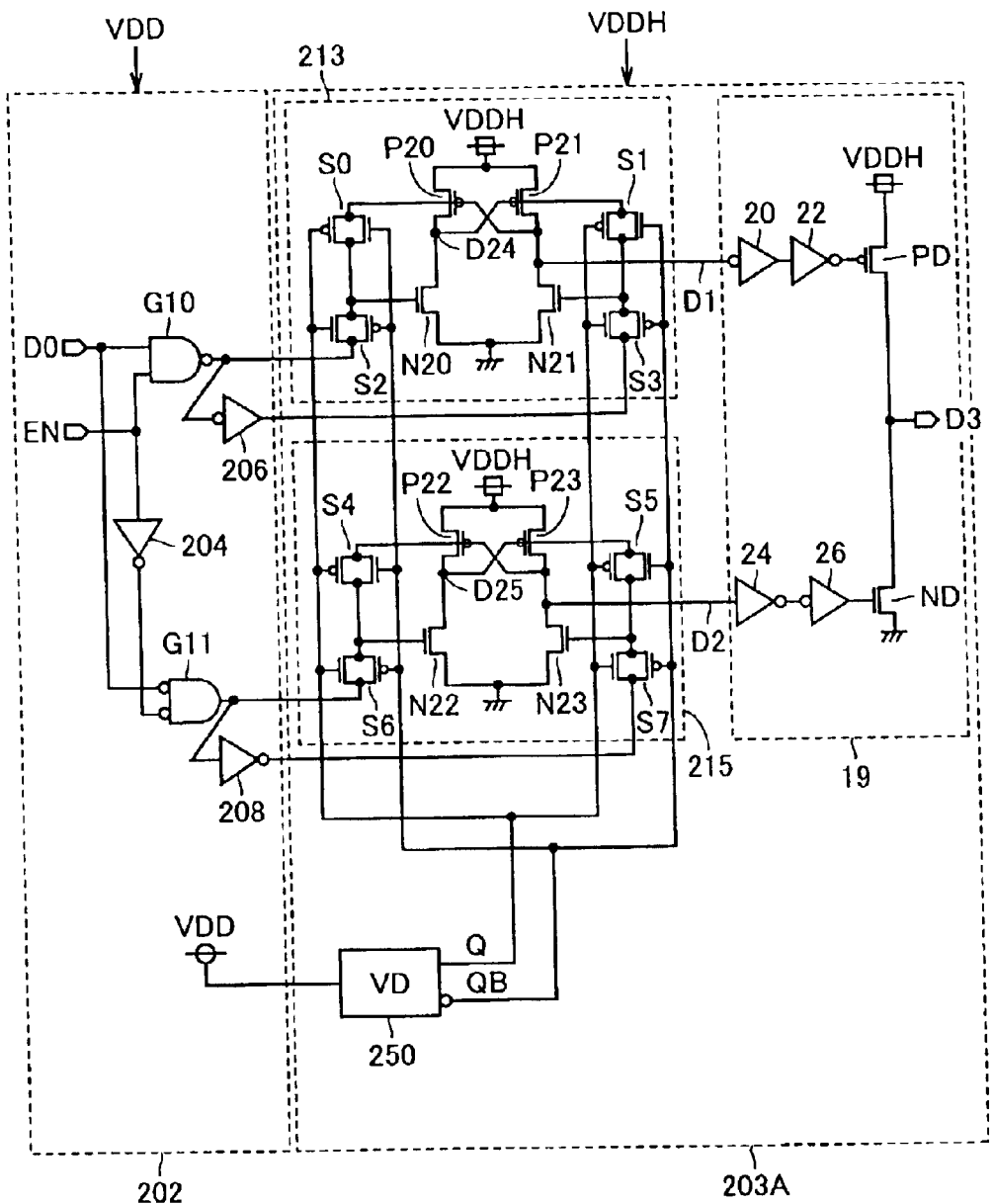
FIG. 17 is a circuit diagram for explaining a connection section between a core section and an interface section of a semiconductor device in the ninth embodiment.

FIG. 17 is a circuit diagram for explaining a connection section between a core section and an interface section in a semiconductor device in the ninth embodiment.

Referring to FIG. 17, the semiconductor device in the ninth embodiment includes an interface section 203A in place of interface section 203 in the configuration described with reference to FIG. 16.

Interface section 203A includes a voltage generator 250 which outputs signals Q and QB in accordance with power supply potential VDD in place of inverters 210 and 212 in the configuration of interface section 203.

Namely, inverter 210 into which mode select signal HM is inputted as shown in FIG. 16 is replaced by voltage detector 250 into which power supply potential VDD of core section 202 is inputted as shown in FIG. 17.

Since the other constituent elements of interface section 203A are equal to those of interface section 203 described with reference to FIG. 16, they will not be repeatedly described herein.

Figure 18:
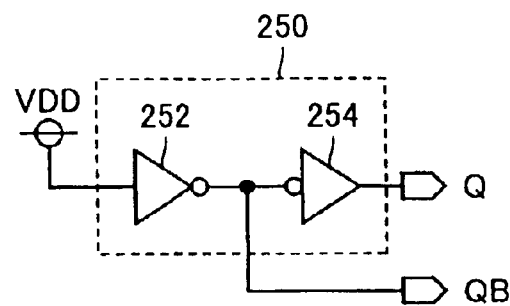
FIG. 18 is a circuit diagram showing the configuration of a voltage detector 250 shown in FIG. 17.

FIG. 18 is a circuit diagram showing the configuration of voltage detector 250 shown in FIG. 17.

Referring to FIG. 18, voltage detector 250 includes an inverter 252 which receives and inverts power supply potential VDD and which outputs signal QB, and an inverter 254 which receives and inverts signal QB and which outputs signal Q.

That is, voltage detector 250 is constituted to detect voltage using simple inverters. If power supply potential VDD of core section 202 is lower than the logical threshold potential VT of inverter 252, voltage detector 250 determines that the power supply of core section 202 is shut down and sets an operation mode to a latch mode. In other words, signal Q becomes L level, signal QB becomes H level, and transmission gates S0 and S1 in level shift circuit 213 shown in FIG. 17 are conductive, thereby forming a latch circuit. At the same time, if transmission gates S2 and S3 are turned off, the gates of N-channel MOS transistors N20 and N21 are separated from core section 202.

Figure 19:
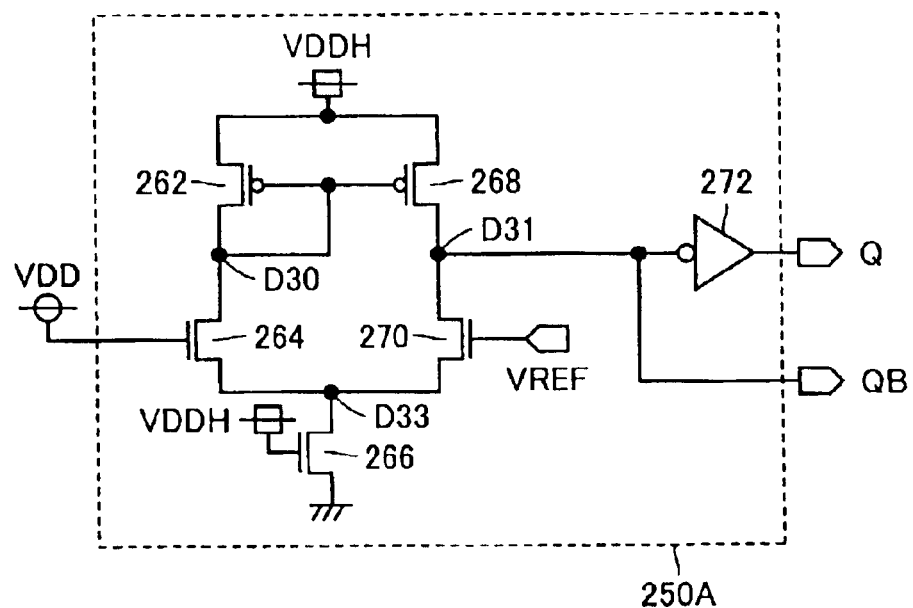
FIG. 19 is a circuit diagram showing a voltage detector 250A which is the second example of the voltage detector.

FIG. 19 is a circuit diagram showing the configuration of voltage detector 250A as the second example of the voltage detector.

Referring to FIG. 19, voltage detector 250A includes a P-channel MOS transistor 262 which is connected between a node applied with power supply potential VDDH and output node D30, an N-channel MOS transistor 264 which is connected between output node D30 and an output node D33 and which has a gate receiving power supply potential VDD, and an N-channel MOS transistor 266 which is connected between output node D33 and a ground node and which has a gate receiving power supply potential VDDH. The gate of N-channel MOS transistor 262 is connected to output node D30.

Voltage detector 250A also includes a P-channel MOS transistor 268 which is connected between the node applied with power supply potential VDDH and an output node D31 and which has a gate connected to output node D30, an N-channel MOS transistor 270 which is connected between output node D31 and output node D33 and which has a gate applied with a reference potential VREF, and an inverter 272 which has an input connected to output node D31 and which outputs signal Q. Signal QB is outputted from output node D31.

By arbitrarily setting reference potential VREF, it is possible to freely define a power supply potential when the core section is in a standby state. If power supply potential VDD is lower than reference potential VREF, then an operation mode is determined as a standby mode, the level shift circuits are separated from the core section and the operation mode is set to a latch mode.

According to the present invention in the ninth embodiment, it is possible to automatically set the operation mode of each level shift circuit in accordance with the change of power supply potential VDD of the core section. It is, therefore, possible to decrease the number of input pins used for mode setting and external control becomes unnecessary.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    an internal circuit receiving a first power supply potential as an operating power supply potential, and outputting a first internal signal; and
    an interface circuit receiving, as the operating power supply potential, a second power supply potential capable of being maintained in an active state even if said first power supply potential is set in an inactive state, and driving an output node in accordance with said first internal signal, said interface circuit including a first level conversion circuit, said first level conversion circuit having
        a first holding circuit holding one of a first logical value and a second logical value complementary to said first logical value,
        a first write circuit writing one of said first and second logical values to said first holding circuit in accordance with said first internal signal, and
        a second write circuit writing said second logical value to said first holding circuit in accordance with an enable signal, and
    said interface circuit further including
        a driving section driving said output node if said first holding circuit holds said first logical value, and turning into a high impedance state with respect to said output node if said first holding circuit holds said second logical value.

2. The semiconductor device according to claim 1, wherein
said internal circuit further outputs a second internal signal,
said interface section further includes
a second level conversion circuit,
said second level conversion circuit has
a second holding circuit holding one of a third logical value and a fourth logical value complementary to said third logical value,
a third write circuit writing one of said third and fourth logical values to said second holding circuit in accordance with said second internal signal, and
a fourth write circuit writing said fourth logical value to said second holding circuit in accordance with said enable signal, and
said driving section turns into the high impedance state with respect to said output node if said first holding circuit holds said second logical value and said second holding circuit holds said fourth logical value.

3. The semiconductor device according to claim 2, wherein
said driving section has
a first output transistor becoming conductive and coupling said output node to a potential corresponding to high level if said first holding circuit holds said first logical value, and
a second output transistor becoming conductive and coupling said output node to a potential corresponding to low level if said second holding circuit holds said third logical value.

4. The semiconductor device according to claim 1, wherein
said interface circuit further includes
a signal output circuit receiving said second power supply potential as the operating power supply potential, and outputting said enable signal.

5. The semiconductor device according to claim 1, wherein
said first holding circuit has
a latch circuit having first and second nodes complementary to each other,
said first write circuit has
a first input driving circuit driving said first holding node so as to write said first logical value to said latch circuit in accordance with said first internal signal, and
a second input driving circuit driving said second holding node so as to write said second logical value to said latch circuit in accordance with said first internal signal, and
said second write circuit has
a third input driving circuit driving said second holding node so as to write said second logical value to said latch circuit in accordance with said enable signal.

6. The semiconductor device according to claim 5, wherein
said first level conversion circuit further includes
a power supply potential monitoring circuit detecting that said first power supply potential is set in the inactive state, and deactivating said first and second input driving circuits.

7. The semiconductor device according to claim 6, wherein
said power supply potential monitoring circuit includes
an inverter having an input receiving said first power supply potential,
a first N-channel MOS transistor connected between an input node of said first input driving circuit and a ground node, and having a gate receiving an output of said inverter, and
a second N-channel MOS transistor connected between an input node of said second input driving circuit and the ground node, and having a gate receiving the output of said inverter.

8. A semiconductor device comprising:
an internal circuit receiving a first power supply potential as an operating power supply potential, and outputting an internal signal, said internal circuit including
a first pulse generation circuit activating said internal signal for a predetermined period in accordance with transition of a data signal;
an interface circuit receiving, as the operating power supply potential, a second power supply potential capable of being maintained in an active state even if said first power supply potential is set in an inactive state, and driving an output node in accordance with said internal signal,
said interface circuit includes
a first level conversion circuit,
said first level conversion circuit has
a holding circuit holding one of a first logical value and a second logical value complementary to said first logical value, and
a write circuit writing one of said first and second logical values to said holding circuit in accordance with said internal signal, and
said interface circuit further includes
a driving section driving said output node if said holding circuit holds said first logical value, and turning into a high impedance state with respect to said output node if said holding circuit holds said second logical value.

9. The semiconductor device according to claim 8, wherein
said internal signal includes
first and second write signals,
said write circuit writes said first logical value to said holding circuit in accordance with activation of said first write signal, and writing said second logical value to said holding circuit in accordance with the activation of said second write signal,
said first pulse generation circuit has
a delay circuit receiving and delaying said data signal by said predetermined period, and
a gate circuit detecting the transition of said data signal if said data signal differs from an output of said delay circuit, and activating one of said first and second write signals in accordance with polarity of said transition.

10. The semiconductor device according to claim 9, wherein
said gate circuit activates one of said first and second write signals in accordance with the transition of said data signal when an internal enable signal is activated, and deactivating both of said first and second write signals when the internal enable signal is deactivated.

11. The semiconductor device according to claim 8, wherein
said internal signal includes
first and second write signals,
said first pulse generation circuit activates one of said first and second write signals in accordance with polarity of the transition of said data signal, said internal circuit further includes
a second pulse generation circuit activating said second write signal for a predetermined period in accordance with the transition of the internal enable signal from the active state to the inactive state, and
said write circuit writes said first logical value to said holding circuit in accordance with activation of said first write signal, and writes said second logical value to said holding circuit in accordance with the activation of said second write signal.

12. The semiconductor device according to claim 8, wherein
said internal signal includes
first and second write signals,
said write circuit writes said first logical value to said holding circuit in accordance with activation of said first write signal, and writes said second logical value to said holding circuit in accordance with the activation of said second write signal,
said first pulse generation circuit has
a first gate circuit outputting said data signal when an internal enable signal is in the active state, and outputting a fixed signal when said internal enable signal is in the inactive state,
a delay circuit receiving an output of said first gate circuit, and delaying the output of said first gate circuit by said predetermined period; and
a second gate circuit detecting the transition of said data signal if the output of said first gate circuit differs from an output of said delay circuit, and activating said first write signal in accordance with polarity of said transition.

13. A semiconductor comprising:
a core section receiving, as operating power supply potentials, a first power supply potential and a second power supply potential, the second power supply potential capable of being maintained in an active state even if the first power supply potential is set in an inactive state, said core section including
a first internal circuit receiving said first power supply potential as the operating power supply potential, and outputting an internal signal, and
a second internal circuit operating in accordance with said internal signal, said second internal circuit having
a level conversion circuit converting a logical amplitude of said internal signal, said level conversion circuit having
a holding circuit holding one of a first logical value and a second logical value complementary to said first logical value, and
a write circuit writing one of said first and second logical values to said holding circuit in accordance with said internal signal; and
an interface circuit receiving a third power supply potential as the operating power supply potential, and mediating data communication between said core section and an outside of the semiconductor device; wherein
said internal signal includes
first and second write signals, and
said first internal circuit has
a pulse generation circuit activating said first write signal for a first predetermined period in accordance with transition of first polarity of an internal data signal, and activating said second write signal for a second predetermined period in accordance with the transition of second polarity of said internal data signal.

14. A semiconductor comprising:
a core section receiving, as operating power supply potentials, a first power supply potential and a second power supply potential, the second power supply potential capable of being maintained in an active state even if the first power supply potential is set in an inactive state, said core section including
a first internal circuit receiving said first power supply potential as the operating power supply potential, and outputting an internal signal, and
a second internal circuit operating in accordance with said internal signal, said second internal circuit having
a level conversion circuit converting a logical amplitude of said internal signal, said level conversion circuit having
a holding circuit holding one of a first logical value and a second logical value complementary to said first logical value, and
a write circuit writing one of said first and second logical values to said holding circuit in accordance with said internal signal; and
an interface circuit receiving a third power supply potential as the operating power supply potential, and mediating data communication between said core section and an outside of the semiconductor device; wherein
said internal signal includes
first and second write signals that are complementary to each other, and said write circuit has
a first input driving circuit activated in accordance with a clock signal, and driving a first holding node of said holding circuit in accordance with said first write signal, and
a second input driving circuit activated in accordance with the clock signal, and driving a second holding node complementary to said first holding node, of said holding circuit in accordance with said second write signal.

15. A semiconductor device comprising:
an internal circuit receiving a first power supply potential as an operating power supply potential, and outputting an internal signal; and
an interface circuit receiving, as the operating power supply potential, a second power supply potential capable of being maintained in an active state even if said first power supply potential is set in an inactive state, and driving an output node in accordance with said internal signal, said interface circuit including
a level conversion circuit converting level of said internal signal, said level conversion circuit including
a level conversion section converting the level of a signal received at an input, and outputting the level-converted signal; and
an input signal switching section applying said internal signal to the input of said level conversion section when a mode setting signal is active, feeding back an output of said level conversion section to the input of said level conversion section and separating said internal signal from the input of said level conversion section when the mode setting signal is inactive, and
said interface circuit further includes
a driving section driving said output node if the output of said level conversion circuit corresponds to a first logical value, and turning into a high impedance state with respect to said output node if the output of said level conversion circuit corresponds to a second logical value.

16. The semiconductor device according to claim 15, wherein said interface section further includes
a voltage detection circuit detecting a change in said first power supply potential, and switching the active state of said mode setting signal.

* * * * *